(12) United States Patent
Tokumo et al.

(10) Patent No.: US 7,112,976 B2
(45) Date of Patent: Sep. 26, 2006

(54) TEST SOCKET, METHOD OF MANUFACTURING THE TEST SOCKET, TEST METHOD USING THE TEST SOCKET, AND MEMBER TO BE TESTED

(75) Inventors: Yasushi Tokumo, Tokyo (JP); Shigeki Maekawa, Tokyo (JP); Yoshihiro Kashiba, Tokyo (JP); Shigeru Takada, Tokyo (JP)

(73) Assignee: Misubishi Denki Kabushiki Kaisha, Tokyo (JP)

( * ) Notice: Subject to any disclaimer, the term of this patent is extended or adjusted under 35 U.S.C. 154(b) by 80 days.

(21) Appl. No.: 10/842,554

(22) Filed: May 11, 2004

(65) Prior Publication Data

US 2004/0209491 A1    Oct. 21, 2004

Related U.S. Application Data

(62) Division of application No. 09/625,047, filed on Jul. 24, 2000, now Pat. No. 6,794,890.

(30) Foreign Application Priority Data

Jul. 27, 1999  (JP) ............................. P. 11-211993
Aug. 6, 1999  (JP) ............................. P. 11-223345

(51) Int. Cl.
    *G01R 1/067* (2006.01)
(52) U.S. Cl. ...................................... 324/761; 324/757
(58) Field of Classification Search ............... None
    See application file for complete search history.

(56) References Cited

U.S. PATENT DOCUMENTS

| 275,759 A | 4/1883 | Fischer |
| 3,701,021 A * | 10/1972 | Issac et el. .................. 324/754 |
| 3,865,462 A | 2/1975 | Cobaugh et al. |
| 3,996,516 A | 12/1976 | Luther |
| 4,047,780 A * | 9/1977 | Cedrone ..................... 324/754 |
| 4,571,540 A | 2/1986 | Stowers et al. |
| 4,995,816 A | 2/1991 | Grabbe |
| 5,599,194 A | 2/1997 | Ozawa et al. |
| 5,634,267 A | 6/1997 | Farnworth et al. |
| 5,974,662 A * | 11/1999 | Eldridge et al. .............. 29/842 |

FOREIGN PATENT DOCUMENTS

| JP | 10-228969 | 8/1989 |
| JP | 4-34380 | 2/1992 |
| JP | 5-94856 | 4/1993 |
| JP | 5-104856 | 4/1993 |
| JP | 58-199545 | 11/1993 |

\* cited by examiner

*Primary Examiner*—Ernest Karlsen
(74) *Attorney, Agent, or Firm*—Buchanan Ingersoll & Rooney PC

(57) ABSTRACT

Two resilient sections are connected to a tip end which is to be brought into contact with an external connection terminal of a contact belonging to a test socket of an electronic device or semiconductor package. The resilient sections provided opposite to each other and are bent so as to extend horizontally with respect to the tip end. The force exerted downward on the tip end is equally distributed between the plurality of resilient sections. The resilient sections are eventually deflected downwardly without involvement of horizontal sliding action. The force which is exerted on the tip end in reaction to the downward deflection of the curved portions brings the tip end into pressing contact with the external connection terminal without involvement of horizontal sliding action of the tip end with respect to the external connection terminal.

8 Claims, 20 Drawing Sheets

FIG.14A  FIG.14B
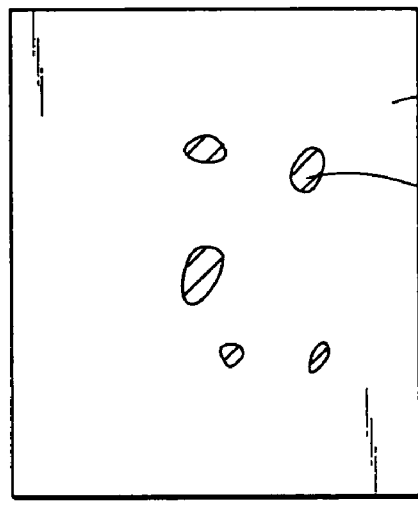
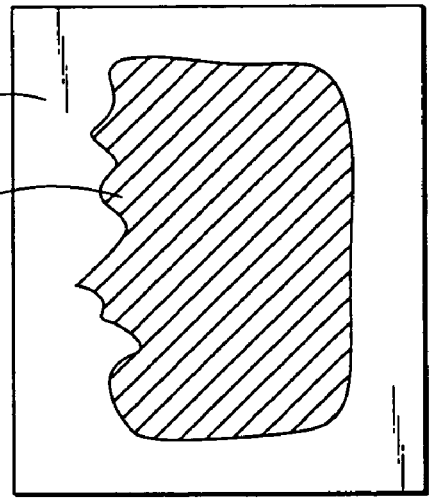
FIG.15
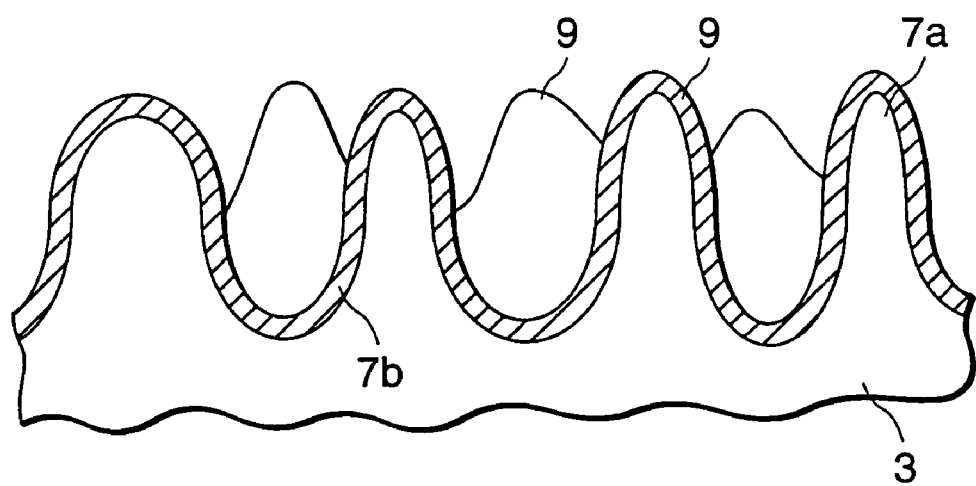

|  | NUMBER OF LOADED ICs n | NUMBER OF DEFECTIVE ICs m | FRACTION DEFECTIVE m/n |
|---|---|---|---|
| CONTACT TERMINAL A | 3016 | 12 | 0.4% |
| CONTACT TERMINAL B | 3000 | 29 | 1.0% |
| CONTACT TERMINAL C | 2900 | 61 | 2.1% |

FIG.31

```
START
  ↓
PRESS INTO A COMPONENT PLATE-LIKE
MATERIAL HAVING THE PROPERTY OF
SPRING, TO THEREBY DEFINE THE OUTER
PROFILE OF A CONTACT TERMINAL
  ↓
SPLIT A TIP END INTO TWO PIECES
THROUGH USE OF NARROW TUNGSTEN WIRE
HAVING A THICKNESS OF 20 TO 90 μm
  ↓
PLATE THE PUNCHED COMPONENT
HAVING THE SPLIT TIP ENDS WITH
NICKEL TO A THICKNESS OF 5 TO 20 μm
  ↓
PLATE PUNCHED COMPONENT
WITH GOLD TO A THICKNESS OF
1 μm OR THEREABOUTS
  ↓
END
```

FIG.32

|  | NUMBER OF LOADED ICs n | NUMBER OF DEFECTIVE ICs m | FRACTION DEFECTIVE m/n |
|---|---|---|---|
| CONTACT TERMINAL A | 3004 | 14 | 0.5% |
| CONTACT TERMINAL B | 3005 | 10 | 0.3% |
| CONTACT TERMINAL C | 3010 | 60 | 2.0% | ated by 5 designates a terminal; 6 designates a support section. In the contact 1, the terminal 5 protrudes downwardly from the horizontally-extending base 1, and the support section 6
TEST SOCKET, METHOD OF MANUFACTURING THE TEST SOCKET, TEST METHOD USING THE TEST SOCKET, AND MEMBER TO BE TESTED This application is a divisional of application Ser. No. 09/625,047 filed Jul. 24, 2000, now U.S. Pat. No. 6,794,890 the entire contents of which are incorporated herein by reference.

BACKGROUND OF THE INVENTION

The present invention relates to a test socket for use in testing the electrical characteristics of an electronic device or a semiconductor package, and more particularly, to the structure of a contact for use in establishing electrical connection when the contact is brought into contact with an external connection terminal of an electronic device or a semiconductor package.

As shown in FIG. 19, a known test socket for use in testing an electronic device, such as an IC or a bare chip, or a semiconductor package, comprises a contact 1 which is formed by means of punching a member having the property of a spring into a predetermined shape, and a housing 11 which fixedly retains the contact 1 and is formed from an insulating material. In order to test a semiconductor package 14, the semiconductor package 14 is placed on a seat 13, and the tip end of the contact 1 is brought into contact with external connection terminals 14a extending from the semiconductor package 14. A press jig 12 is pressed against the external connection terminals 14a, to thereby establish electrical connection between the external connection terminals 14a and the contact 1. A predetermined test signal is transmitted to and received from electrical circuits provided within the semiconductor package 14, by way of the contact 1 and the external connection terminals 14a.

FIG. 20 is a plan view showing the contact 1 provided in the known test socket shown in FIG. 19. In the drawing, reference numeral 1 designates a contact; 2 designates a resilient section; 3 designates a tip end which is to be brought into contact with external connection terminals of an electronic device or a semiconductor package; 4 designates a base; and 5 designates a terminal. The terminal 5 to be connected to a test circuit board protrudes downwardly from the base 4, which is provided for positioning the test socket and extends horizontally. The resilient section 2 protrudes from the base 4 upwardly while being bent horizontally. The tip end 3 is provided at the free end of the resilient section 2 and is imparted with elasticity with respect to the vertical direction. The press jig 12 is pressed against the external connection terminals 14a while the external connection terminals 14a of an electronic device or the semiconductor package 14 are placed on the tip end 3. As indicated by a dotted line shown in FIG. 20, the tip end 3 is displaced downwardly while involving horizontal movement and deflecting the U-shaped resilient section 2. By means of the restoration force of the deflected resilient section 2, the tip end 3 is brought into pressing contact with the external connection terminals 14a.

FIG. 21 is a plan view showing the shape of a contact described in the Unexamined Japanese Patent Application Publication No. Hei 5-104856. In the drawing, reference numeral 1 designates a contact; 2a and 2b designate resilient sections; 3 designates a tip end; 4 designates a base; 5 designates a terminal; and 6 designates a support section. In the contact 1, the terminal 5 protrudes downwardly from the horizontally-extending base 1, and the support section 6 protrudes upward from the base 4. The base end of a first resilient section 2a and the base end of a second resilient section 2b are connected to the support section 6 such that the first and second resilient sections 2a and 2b extend horizontally while being spaced a certain distance apart from each other in the vertical direction. The tip end 3 to be brought into contact with the external connection terminals 14a of an electronic device or the semiconductor package 14 is connected to the free end of the first resilient section 2a and the free end of the second resilient section 2b. Vertical elasticity is imparted to the tip end 3. The contact 1 can retard horizontal movement of the tip end 3, which would otherwise be involved at the time of downward movement of the tip end 3, by means of the first resilient section 2a and the second resilient section 2b. As a result, there can be prevented disengagement of the external connection terminals 14a of an electronic device or the semiconductor package 14 from the tip end 3, or deformation of the external connection terminals 14a, which would otherwise be caused when the semiconductor package 14 is displaced while the external connection terminals 14a are disengaged from the tip end 3.

FIG. 22 is a plan view showing the shape of a contact described in the Unexamined Japanese Patent Application Publication No. Hei 4-34380. In the drawing, reference numeral 1 designates a contact; 2a and 2b designate resilient sections; 3 designates a tip end; and 5 designates a terminal. The contact 1 is formed by means of vertically stacking two hair-pin-like resilient sections 2a and 2b so as to constitute an S-shaped geometry, and attaching the tip end 3 to an upper free end of the two resilient sections 2a and 2b. The terminal 5 is attached to a lower free end of the two resilient sections 2a and 2b. The two resilient sections 2a and 2b are bent in opposite directions, and hence the contact 1 having the resilient sections 2a and 2b has the function of retarding horizontal movement, which would otherwise be involved by vertical movement of the tip end 3.

The surfaces of the external connection terminals 14a of an electronic device or the semiconductor package 14 are usually plated, and an oxide film is formed on the surface of the external connection terminals 14a. Hence, the external connection terminals 14a have high electrical resistance. There is a necessity for establishing good electrical contact between the external connection terminals 14a and the tip end 3 of the contact 1 by means of removing the oxide film and increasing the area of contact between the external connection terminals 14a and the tip end 3. FIG. 23 is a perspective view showing the shape of a contact 1 which is to realize good electrical contact and is described in the Unexamined Japanese Patent Application Publication No. Sho 58-199545. In the drawing, reference numeral 1 designates a contact; 2 designates a resilient section; 3 designates a tip end; 3a designates a protuberance; and 5 designates a terminal. In the contact 1 having such a structure, a plurality of protuberances 3a are formed in the tip end 3 with which the external connection terminals 14a are to be brought into contact. Even in a case where an oxide film is formed on the surface of the external connection terminals 14a, the contact 1 has the function of breaking the oxide film, to thereby ensure electrical contact with the external connection terminals 14a.

In the known contact shown in FIG. 20, external connection terminals are moved horizontally by several hundreds of micrometers when contact pressure is applied to the external connection terminals, as a result of which the external connection terminals are disengaged from the tip end. Use of either one of the contacts shown in FIGS. 21 and 22 prevents disengagement of the external connection terminals from the contact, which would otherwise be caused by horizontal movement of the external connection terminals. Such a known contact involves external connection terminals being moved about 50 µm horizontally and fails to eliminate relative sliding movement, which would arise between the tip end 3 of the contact and the external connection terminals 14a. The external connection terminal 14a is formed from a 42-alloy, and solder plating having a thickness of about 10 µm is formed on the surface of the external connection terminal 14a. Since the surface of the solder plating is naturally oxidized, the surface of the external connection terminal 14a is coated with an oxide. In a case where relative sliding movement arises between the external connection terminals 14a and the tip end 3, the tip end 3 scrapes a solder or solder oxide which covers the external connection terminals 14a. The resultant agglomerate adheres to and are accumulated on the surface of the tip end 3. Particularly in a case where the accumulated agglomerate corresponds to insulating oxides, electrical connection is hindered. As a result, the semiconductor package may be erroneously determined to be defective even though the semiconductor package is non-defective. In contrast, in a case where the accumulated agglomerate is conductive oxides such as solder, high contact resistance arises between the external connection terminals and the tip end 3, and the semiconductor package may be erroneously determined to be defective. In either case, an electronic device or semiconductor package, which has been determined to be defective, is uneconomically discarded. In order to prevent occurrence of uneconomical discarding of a non-defective electronic device or semiconductor package, a test socket must be replaced with a new one after a short period of use. This accounts for the shortening of the life of a test socket for testing an electronic device or a semiconductor package.

In the case of use of a contact having protuberances provided on its tip end shown in FIG. 23, good electrical contact can be achieved during an early period. Bringing external connection terminals in contact with the tip end of the contact involves horizontal movement of the external connection terminals. Further, the surface of the external connection terminals is scraped by the sharp protuberances, which inevitably involves formation of a large amount of agglomerate. As in the case of the previously-described background art, the life of the test socket is shortened.

Either of the previously-described contacts involves horizontal movement of external connection terminals, which in turn results in formation and deposition of agglomerate. The resultant agglomerate is scraped from the external connection terminals as a result of repeated used of the contact. In a case where agglomerate is conductive and adheres to external connection terminals so as to extend across the contacts, electrical shortcircuit may arise. Further, the agglomerate that adheres to the external connection terminals causes soldering failures when a semiconductor package is mounted. In association with an increase in the size of an electronic device or semiconductor package and the number of terminals, a pitch between external connection terminals is made narrower, and hence agglomerate imposes a serious problem.

Besides, generally, an electric device or a semiconductor package 14 are protected by resin molding. After molding, unnecessary resin is cut off. During cutting off, resin trash sometimes attaches to external terminal 14a. The trash avoids electric connection between a contact terminal and the external terminal. Due to this, a good electric device or a good semiconductor packaging are deteriorated.

SUMMARY OF THE INVENTION

In order to solve the problems, the object of the present invention is to provide a test socket for use in testing an electronic device or semiconductor package, the test socket being able to stably and continuously establish good electrical contact between the contact and the external connection terminals. Particularly, the present invention is aimed at providing a contact which prevents formation of agglomerate, which would otherwise be caused when a contact comes into sliding contact with external connection terminals, and ensures electrical connection between the contact and the external connection terminals.

Accordingly, the present invention provides a test socket which includes a contact to be electrically connected to an external connection terminal of a member to be tested and is to be used for testing the electrical characteristic of the member, wherein the contact has a tip end to be brought into contact with the external connection terminal; and resiliently-deformable bulging sections which extend horizontally with respect to the tip end.

Preferably, the resiliently-deformable bulging sections are two members which are disposed opposite to each other and extend in opposite horizontal directions with respect to the tip end.

Preferably, the resiliently-deformable bulging sections are two members which are disposed opposite to each other with respect to the tip end, and the rigidity of one member differs from that of the other member.

Preferably, a portion of the tip end to be brought into contact with the external connection terminal of the member to be tested is formed into a roundly-pointed shape or a substantially hemi-spherical shape.

Preferably, a portion of the tip end to be brought into contact with the external connection terminal of the member is formed so as to assume a smooth corrugated geometry.

Preferably, a plurality of protuberances formed from smooth surfaces and a plurality of recesses which are adjacent to the protuberances and are formed from smooth surfaces are formed in the tip end to be brought into contact with the external connection terminal of the member.

Preferably, an agglomerate-resistant member is provided on a plurality of protuberances formed from smooth surfaces and on a plurality of recesses which are adjacent to the protuberances and are formed from smooth surfaces.

Preferably, the agglomerate-resistant member is formed from the material selected from the group comprising: chromium, tungsten, titanium nitride, diamond-like carbon, and diamond.

The present invention also provides a method of manufacturing the test socket defined previously, the method comprising the steps of:

punching material so as to define the profile of a contact of a test socket belonging to an electronic device or semiconductor package;

forming, in a tip end to be brought into contact with an external connection terminal of a member to be tested of the punched component, a plurality of protuberances and a plurality of recesses from smoothly-curved surfaces such that the recesses are located adjacent to the protuberances; and forming a film on the punched component having the irregularities formed therein.

The present invention further provides a test method involving use of the test socket as defined in any one of claims 1 through 8, comprising the steps of:

bringing an external connection terminal of a member to be tested into contact with a tip end of the contact of the test socket;

sending, to the member, an electric signal transmitted from a terminal connected to a circuit board; and testing the operation of the member through use of the electric signal returned from the test member.

The present invention also provides a member tested by the test method which involves use of the test socket described above. The operation of the member is tested without involvement of flaws being formed in the external connection terminal of the member, or only involving formation of minute slide flaws having a length of about 10 µm.

In order to solve the problems, the object of the present invention is to provide a test socket for use in testing an electronic device or semiconductor package, the test socket being able to stably and continuously establish good electrical contact between the contact and the external connection terminals. Particularly, the present invention is aimed at providing a contact which prevents formation of agglomerate, which would otherwise be caused when a contact comes into sliding contact with external connection terminals, and ensures electrical connection between the contact and the external connection terminals.

A test socket which includes a contact to be electrically connected to an external connection terminal of a member to be tested and is to be used for testing the electrical characteristic of the member, wherein the contact has a plurality of tip ends to be brought into contact with the external connection terminal;

resilient sections connected to the respective tip ends; and a support section to which the resilient sections are connected or to which one resilient section is connected by way of the other resilient section.

Preferably, the resilient sections connected to the tip ends are two members which are disposed opposite to each other and bent so as to extend horizontally in opposite horizontal directions with respect to the tip ends.

Preferably, a clearance is defined between the plurality of tip ends.

Preferably, a vector is defined by means of interconnecting a resilient section connected to a tip end, the center of a connection section at which a support section supports the resilient section, and the center of the tip end to be brought into contact with an external connection terminal of a member to be tested, and the vector substantially matches the direction in which the tip end is brought into contact with the external connection terminal.

Preferably, a portion of at least one of the tip ends to be brought into contact with the external connection terminal of the member to be tested is formed into a roundly-pointed shape or a substantially hemi-spherical shape.

Preferably, a portion of at least one of the tip ends to be brought into contact with the external connection terminal of the member is formed so as to assume a smooth corrugated geometry.

Preferably, a plurality of protuberances and recesses are formed from smooth surfaces in at least one of the tip ends to be brought into contact with the external connection terminal of the member such that the protuberances and recesses are adjacent to each other are formed.

Preferably, an agglomerate-resistant member is provided on the plurality of protuberances formed from smooth surfaces and on the plurality of recesses which are adjacent to the protuberances and are formed from smooth surfaces.

Preferably, the agglomerate-resistant member is formed from the material selected from the group of: chromium, tungsten, titanium nitride, titanium carbide-nitride, diamond-like carbon, and diamond.

The present invention also provides a method of manufacturing the test socket described above, the method comprising the steps of:

punching a member having the property of a spring into a component so as to define the profile of a contact of a test socket belonging to an electronic device or semiconductor package;

splitting a tip end of the contact into a plurality of pieces; and plating the thus-punched component.

The present invention also provides a method of manufacturing the test socket described above, comprising the steps of:

punching a member having the property of a spring into a component, so as to define the profile of a contact of a test socket belonging to an electronic device or semiconductor package;

splitting a tip end of the contact into a plurality of pieces;

forming a plurality of protuberances and recesses from smooth surfaces in the surfaces of the tip end such that the protuberances and recesses are adjacent to each other;

plating the thus-roughened component.

The present invention provides a test method involving use of the test socket described above, comprising the steps of:

bringing an external connection terminal of a member to be tested into contact with a tip end of the contact of the test socket;

sending, to the member, an electric signal transmitted from a terminal connected to a circuit board; and testing the operation of the member through use of the electric signal returned from the test member.

According to the present invention, the operation of a member is tested by means of bringing the tip end of the contact of the test socket described above into contact with the member, such that no flaws are formed in an external connection terminal of the member or only minute slide flaws having a length of about 10 µm are formed.

BRIEF DESCRIPTION OF THE DRAWINGS

FIGS. 14A and 14B are plan view showing agglomerate deposited on the tip end of the test socket according to the 6th and the 19th embodiments, in comparison with the agglomerate deposited on a tip end of a contact belonging to a known test socket;

FIG. 15 is a cross-sectional view showing irregularities formed in a tip end of a contact belonging to a test socket according to a 7th and a 20th embodiments of the present invention;

FIG. 31 is a table showing a fraction defective of semiconductor packages which are tested through use of the three types of contacts employed in a 23rd embodiment of the present invention; and FIG. 32 is a table showing fraction defectives of semiconductor packages determined by a test through use of test contacts according to a 24th embodiment, in comparison with fraction defectives of semiconductor packages determined by a test through use of a known test socket.

DETAILED DESCRIPTION OF THE PREFERRED EMBODIMENTS (1st Embodiment)

Figure 1:
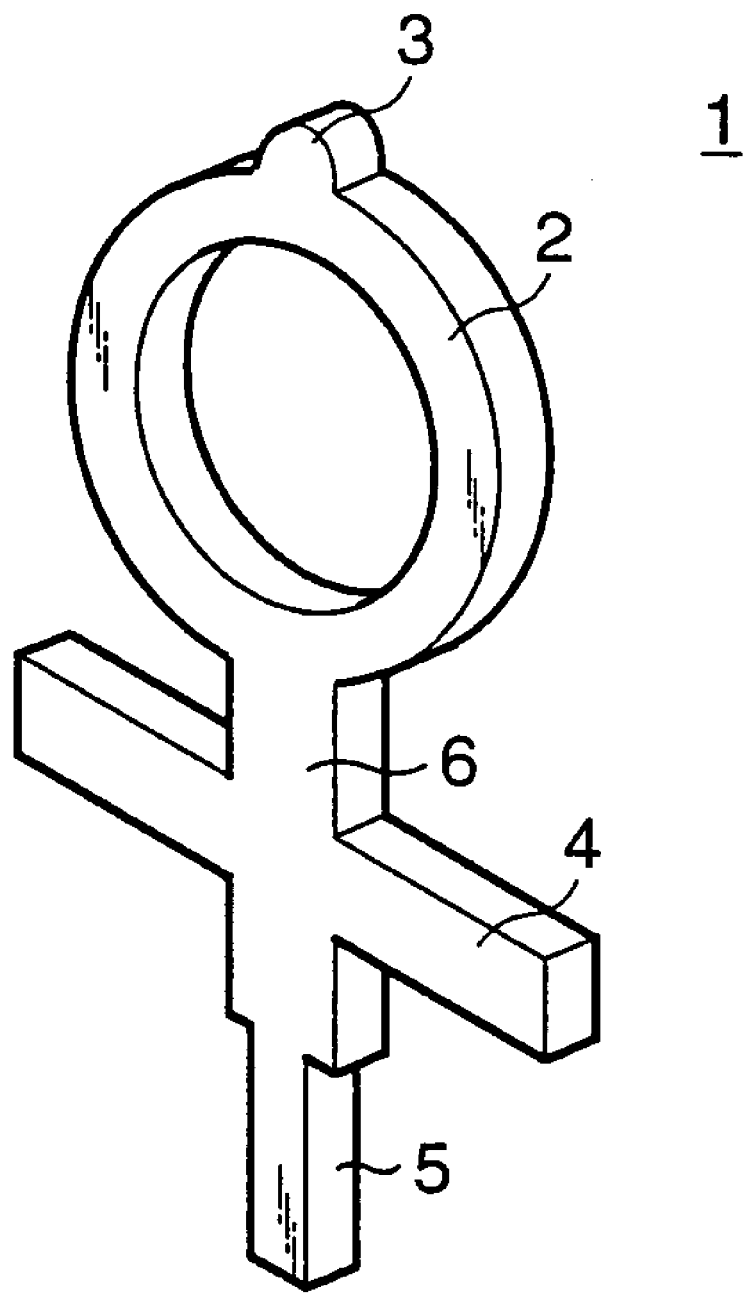
FIG. 1 is a perspective view showing the structure of a contact of a test socket according to a 1st embodiment of the present invention.
Figure 2:
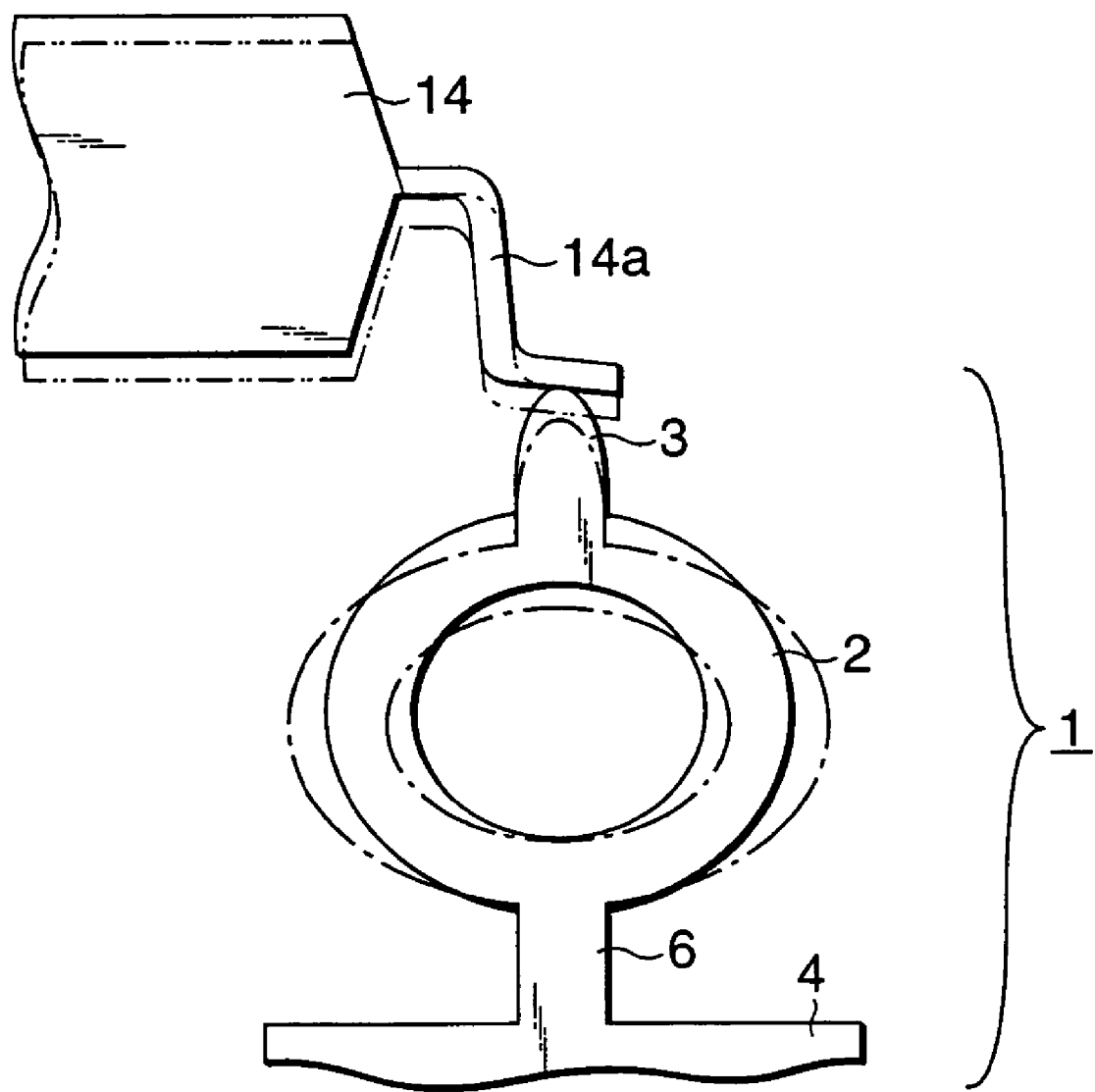
FIG. 2 is a front view showing the operation of the contact of the test socket according to the 1st embodiment.

Preferred embodiments of the present invention will be described hereinbelow by reference to the accompanying drawings. FIG. 1 is a perspective view showing the structure of a contact of a test socket for testing an electronic device or a semiconductor package according to a 1st embodiment of the present invention. FIG. 2 is a front view showing the operation of the contact shown in FIG. 1. In the drawings, reference numeral 1 designates a contact; 2 designates a resilient section; 3 designates a tip end; 4 designates a base; 5 designates a terminal to be connected with a test circuit board; 6 designates a support; 14 designates a semiconductor package; and 14a designates an external connection terminal.

The contact 1 of the test socket has the tip end 3 to be brought into contact with the external connection terminal 14a of the semiconductor package 14, the external connection terminal 14a being a free end, and the resilient section 2 connected to the tip end 3. The resilient section 2 is formed from two pieces of resilient material (hereinafter referred to as "two resilient pieces 2"), and the two resilient pieces 2 extend from respective sides of the tip end 3. The two resilient pieces 2 are connected to a single support 6, and the base 4 to be used for positioning a socket extends horizontally from the support 6. The terminal 5 to be connected to a test board is connected to a lower portion of the support 6. The external connection terminal 14a of the semiconductor package 14 is placed on the tip end 3, and an unillustrated press jig is pressed against the external connection terminal 14a. The force exerted downward on the tip end 3 is equally distributed between two curved portions of the resilient section 2, which curves are provided opposite to each other with respect to the center of the tip end 3. The two curved portions are deflected downwardly, and the force which is exerted on the tip end 3 in reaction to the downward deflection of the two curved portions brings the tip end 3 into pressing contact with the external connection terminal 14a. At this time, the two resilient curved portions are deflected to the same extent, and hence horizontal movement of the resilient section 2 is not involved. Consequently, there can be prevented scraping of a member constituting the external connection terminal 14a or formation of oxides on the external connection terminal 14a, which would otherwise be caused when relative sliding movement arises between the tip end 3 and the external connection terminal 14a. Accordingly, there can be prevented generation and accumulation of agglomerate on the surface of the tip end 3.

(2nd Embodiment)

Figure 3:
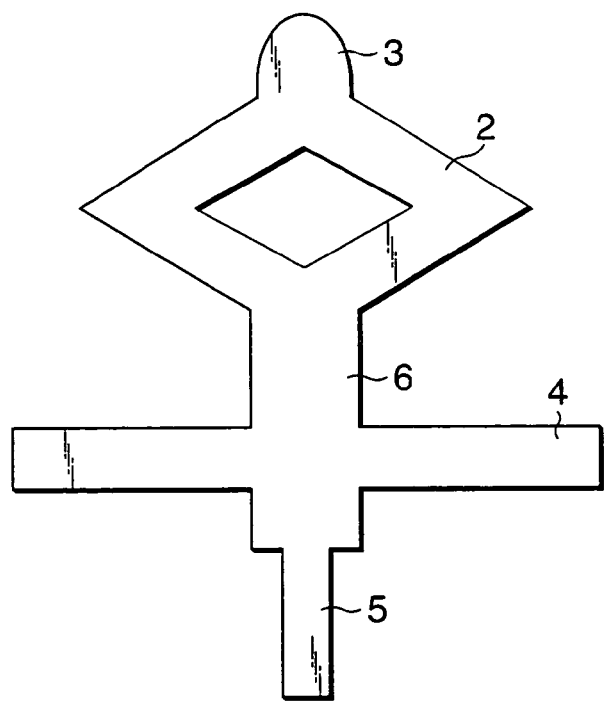
FIG. 3 is a front view showing a contact of a test socket according to a 2nd embodiment of the present invention.

FIG. 3 is a front view showing the structure of a contact of a test socket for testing an electronic device or semiconductor package according to a 2nd embodiment of the present invention. In the drawing, reference numeral 1 designates a contact; 2 designates a resilient section; 3 designates a tip end; 4 designates a base; 5 designates a terminal to be connected with a test circuit board; and 6 designates a support.

The contact 1 having the foregoing structure comprises the tip end 3 to be brought into contact with an external connection terminal of a semiconductor package, the terminal being a free end; and the resilient section 2 connected to the tip end 3. The resilient section 2 is formed into the shape of a rhombus, and two sharp-angular portions of the rhomboid resilient section 2 extend horizontally with respect to the tip end 3. The two angular portions of the resilient section 2 are connected to the single support 6. The base 4 is connected to the support 6 so as to extend horizontally and position a socket. Further, the terminal 5 to be connected to a test board is connected to a downward portion of the support 6. The external connection terminal 14a of the semiconductor package 14 is placed on the tip end 3, and an unillustrated jig is pressed against the external connection terminal 14a. As in the case of the 1st embodiment, there can be prevented formation and deposition of agglomerate on the surface of the tip end 3.

(3rd Embodiment)

FIGS. 4 through 7 are front views showing the configuration of a contact of a test socket for testing an electronic device or semiconductor package according to a 3rd embodiment of the present invention. In the drawings, reference numeral 1 designates a contact terminal; 2c, 2d, and 2f designate resilient sections; 3 designates a tip end to be brought into contact with an external connection terminal of a semiconductor package; 4 designates a base; and 6 designates a support.

Figure 4:
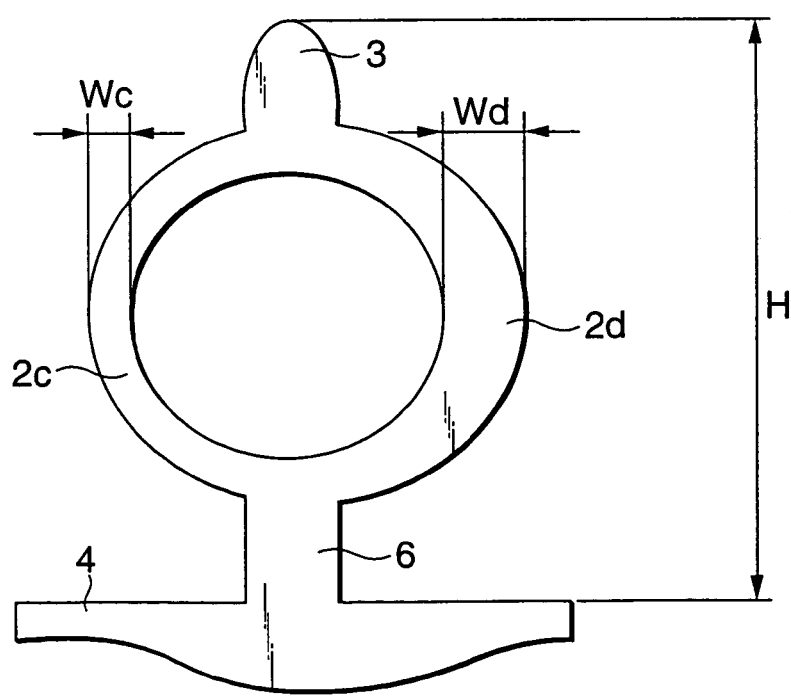
FIG. 4 is a front view showing a contact of a test socket according to a 3rd embodiment of the present invention.

In the present embodiment, as shown in FIG. 4, the height H of the resilient section is set to a value of 5 to 10 mm or thereabouts. The first resilient section 2c having a width Wc of about 0.5 mm and the second resilient section 2d having a width Wd of about 1 mm are arranged opposite to each other with respect to the tip end 3. A force of about 50 g is exerted on the contact 1 from the above by means of an unillustrated press jig. As a result, the tip end 3 to be brought into contact with an external connection terminal of a semiconductor package is moved horizontally about 10 to 20 μm toward the first resilient section 2c. In the contact 1 having such a structure, the trace amount of horizontal displacement can be applied to the tip end 3. The tip end 3 can be unfailingly brought into contact with the external connection terminal while formation of agglomerate is minimized. Further, the distance over which the tip end 3 is slid can be changed by means of changing the width of each of the resilient sections 2C and 2D, thus imparting appropriate horizontal displacement to the tip end 3.

Figure 5:
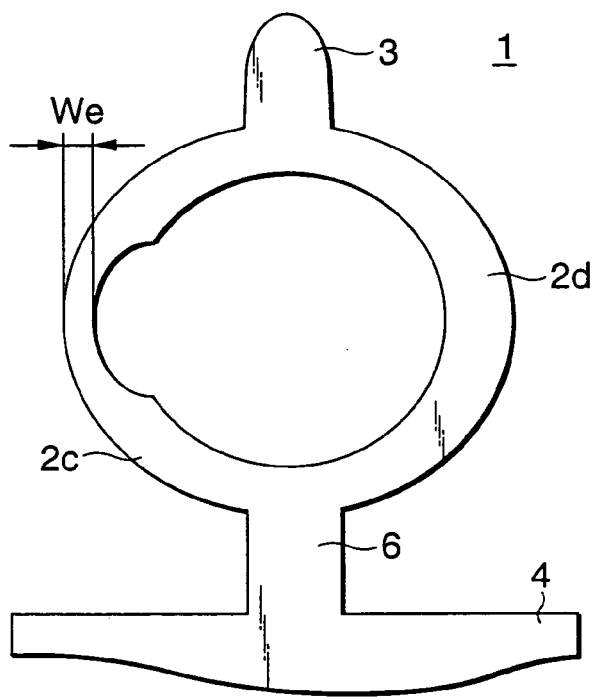
FIG. 5 is a front view showing a contact of another test socket for testing an electronic device or semiconductor package according to the 3rd embodiment of the present invention.

Although the present embodiment has described an example in which two resilient sections have different widths, the advantageous result yielded by the present embodiment can be yielded even when the two resilient portions have identical widths Wc and Wd or either of the two resilient portions has a smaller width We, as shown in FIG. 5.

Figure 6:
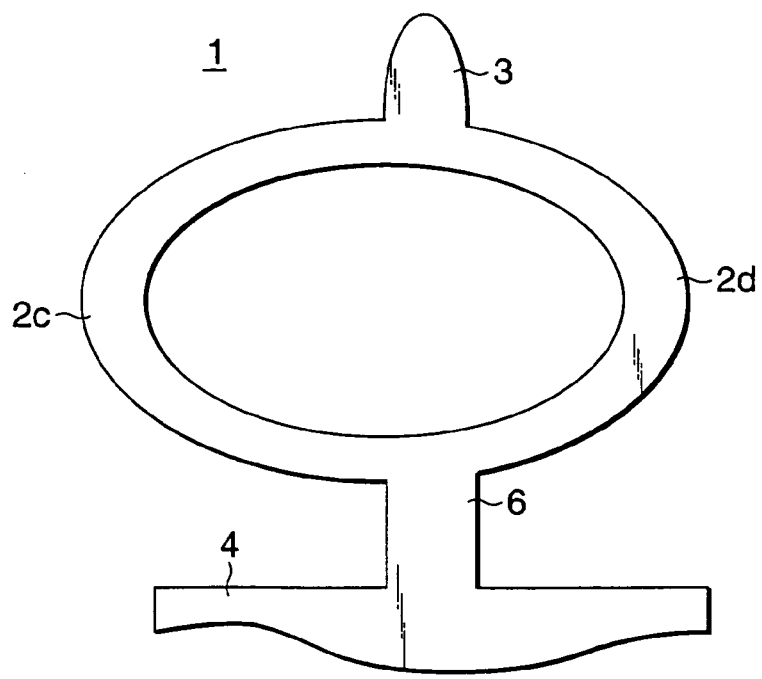
FIG. 6 is a front view showing a contact of still another test socket according to the 3rd embodiment of the present invention.
Figure 7:
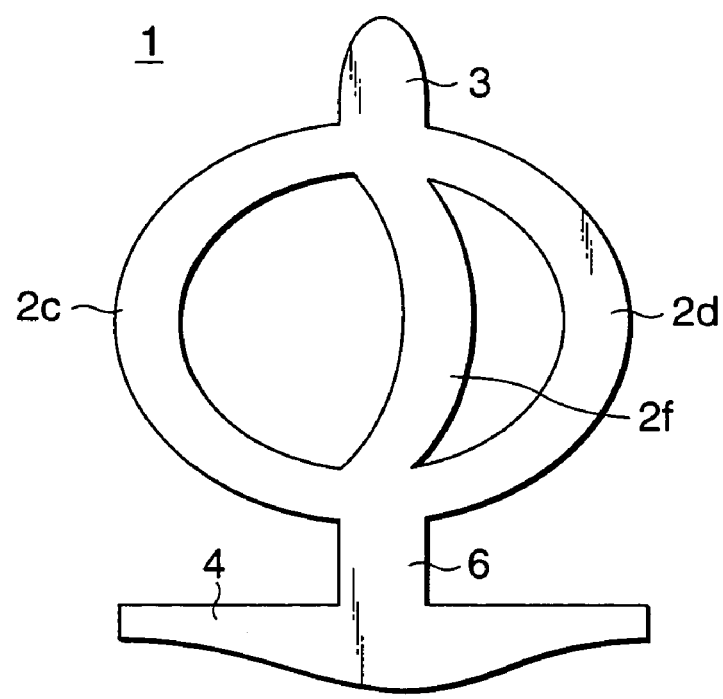
FIG. 7 is a front view showing a contact of yet another test socket according to the 3rd embodiment of the present invention.

The primary object of the 3rd embodiment is to change the flexural rigidity of each of the resilient sections 2c and 2d. The advantageous result yielded by the present embodiment can be achieved even in a case where the resilient sections 2c and 2d are changed in length, as shown in FIG. 6, where a third resilient section 2f is added to the two resilient sections 2c and 2d, as shown in FIG. 7, or where the material of the resilient section is partially changed, in addition to the case where the resilient sections 2c and 2d are changed into the example resilient section shown in FIG. 4 or 5.

(4th Embodiment)

Figure 8:
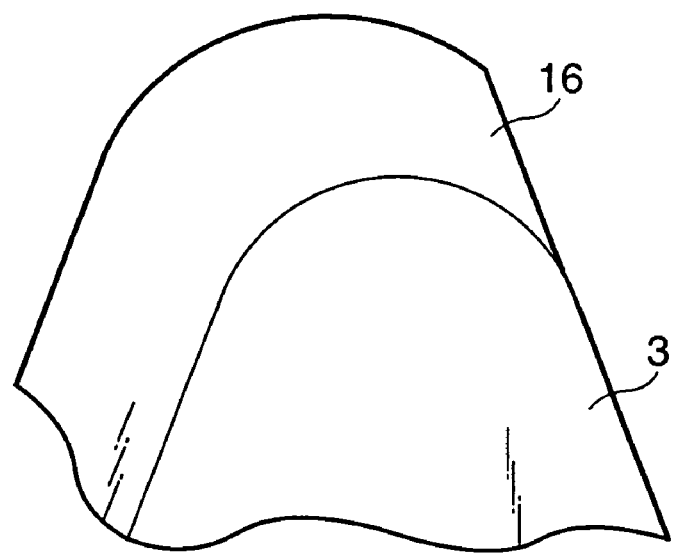
FIG. 8 is a perspective view showing the structure of a contact of a test socket according to a 4th and a 17th embodiments of the present invention.
Figure 9:
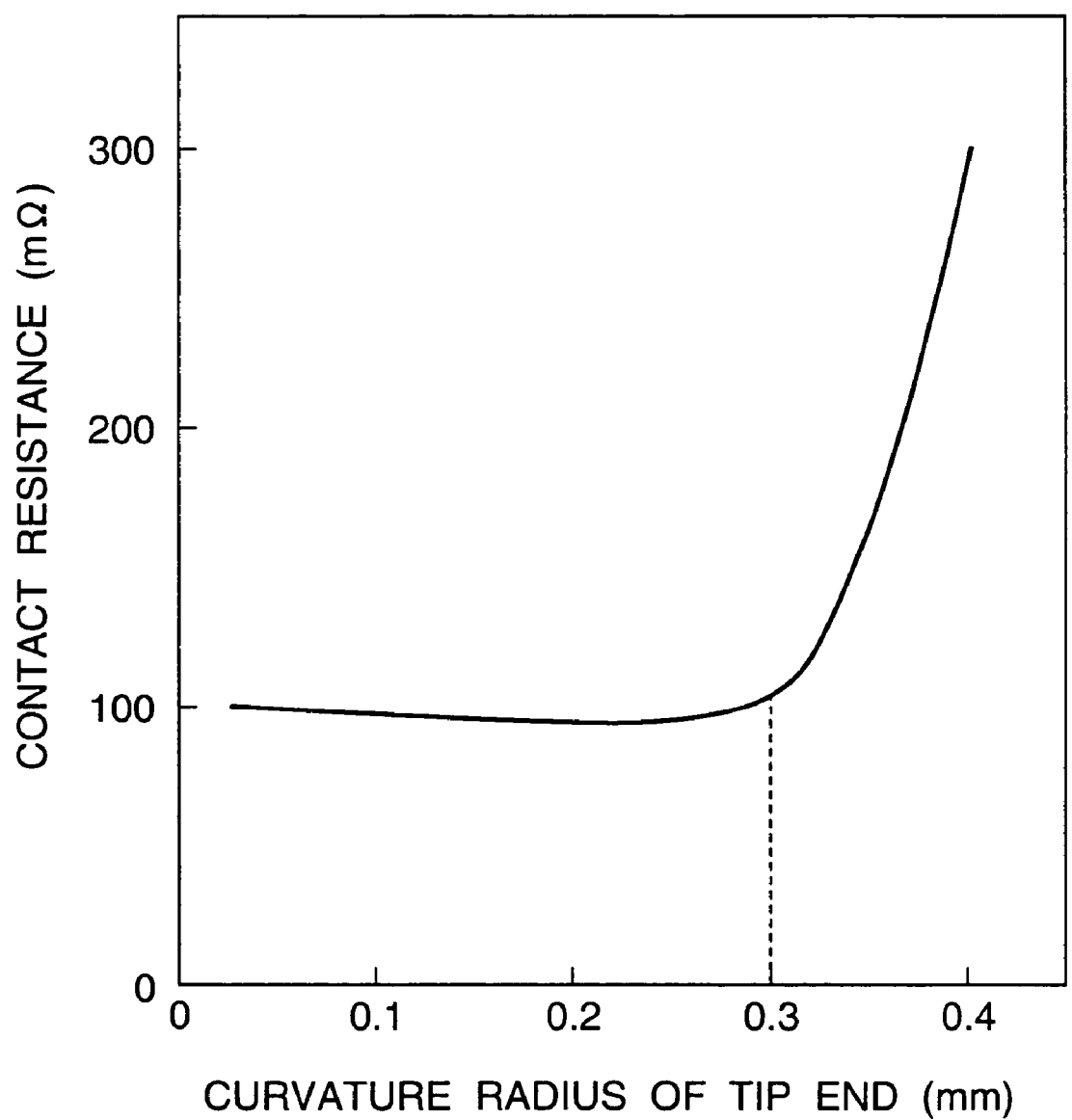
FIG. 9 is a graph representing the relationship between contact resistance and the curvature radius of the tip end obtained when the contact of a test socket according to the 4th and the 17th embodiments is used.

FIG. 8 is a perspective view showing a portion of the tip end belonging to a contact of a test socket according to a 4th embodiment of the present invention. The tip end 3 is formed into a roundly-pointed head having a certain thickness. Contacts according to the present embodiment are formed from beryllium having a thickness of 0.2 mm by means of pressing, and the roundly-pointed heads of the contacts are of different radii of curvature. Test sockets are manufactured through use of these contacts, and a force of about 50 g is exerted on the tip end of the contact of respective test socket from above, through use of a press jig, thereby examining the relationship between contact resistance and the curvature radius of the tip end. FIG. 9 shows test results. The graph shown in FIG. 9 represents the relationship between contact resistance and the curvature radius of the tip end obtained when the contacts of test sockets according to the present embodiment are used. It can be ascertained that contact resistance can be suppressed when the tip end 3 is provided with the roundly-pointed portion 16 having a curvature radius of about 0.3 mm or less.

Although the present embodiment has described the relationship between contact resistance and the curvature radius of the tip end obtained in the case of use of the test socket whose the tip end 3 has the roundly-pointed portion 16, the same relationship can be achieved even in a case where the tip end 3 is formed into a substantially-hemi-spherical portion 17. Further, the same relationship is achieved even in a case where the tip ends 3 of the contacts 1 of the test sockets described in the 2nd and 3rd embodiments are formed into a substantially-hemi-spherical shape or a roundly-pointed shape.

(5th Embodiment)

Figure 11:
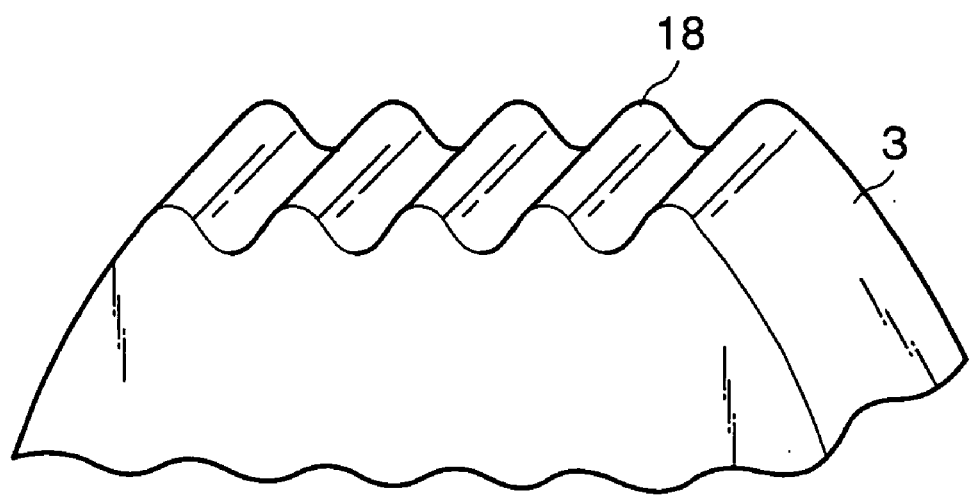
FIG. 11 is a perspective view showing the structure of a contact of a test socket according to a 5th and an 18th embodiments of the present invention.

FIG. 11 is a perspective view showing the structure of a tip end of a contact of a test socket according to a 5th embodiment of the present invention. Reference numeral 3 designates a tip end; and 18 designates a corrugated portion formed in a portion of the tip end 13. In a case where the curvature radius of each of the corrugations 18 is set to 0.3 mm or less, there is yielded the advantageous result yielded in the 4th embodiment is yielded.

(6th Embodiment)

Figure 12:
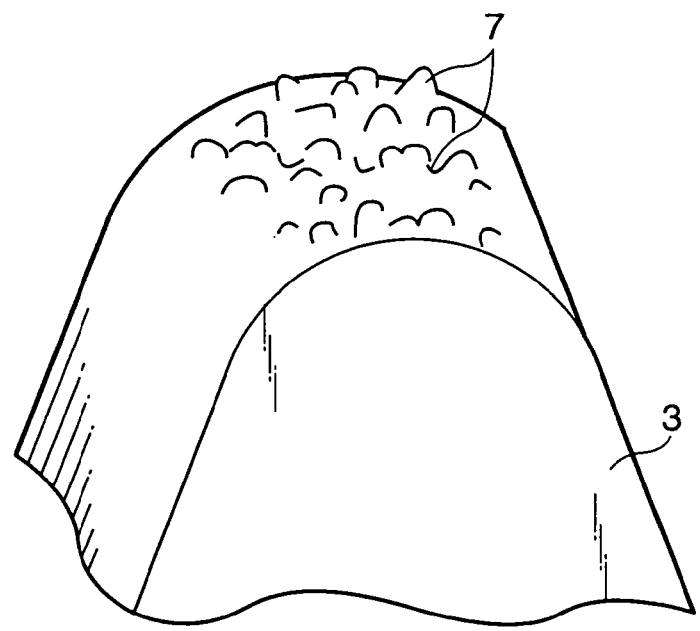
FIG. 12 is a perspective view showing the structure of a contact of a test socket according to a 6th and a 19th embodiments of the present invention.
Figure 13:
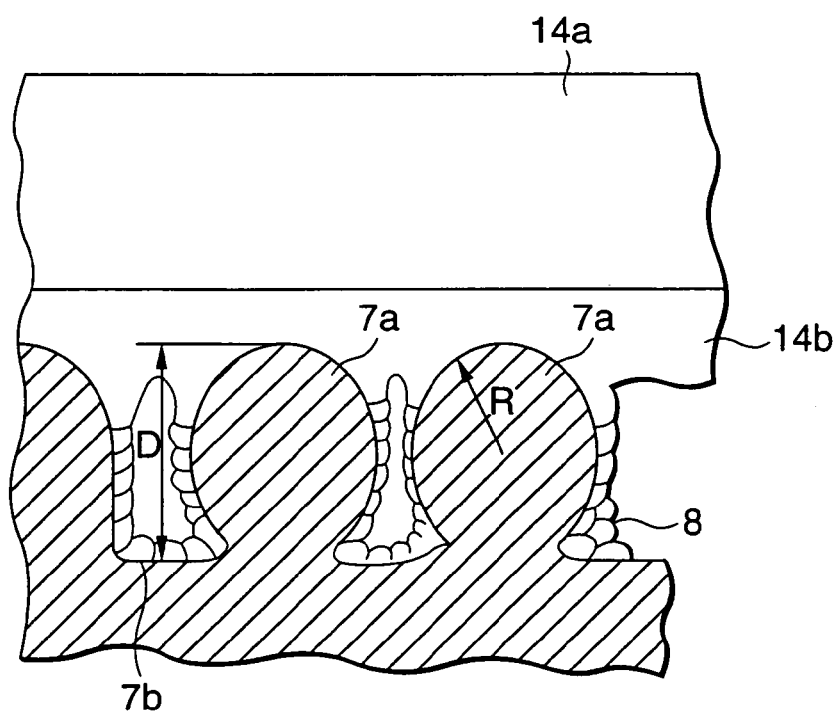
FIG. 13 is an enlarged cross-sectional view schematically showing a tip end of a contact when the tip end of the test socket according to the 6th and the 19th embodiments is in contact with an external connection terminal.

FIG. 12 is a perspective view showing the structure of a tip end of a contact belonging to a test socket according to a 6th embodiment of the present invention. FIG. 13 is an enlarged cross-sectional view showing a tip end of a contact when the tip end is in contact with an external connection terminal. FIG. 14 is a plan view showing agglomerate deposited on the tip end in comparison with the agglomerate deposited on a tip end of a contact belonging to a known test socket. In the drawings, reference numeral 3 designates a tip end; 7 designates irregularities formed on the tip end 3; 7a shown in FIG. 12 designates a plurality of protuberances formed from smoothly-curved surfaces; 7b designates a plurality of smoothly-curved recesses formed adjacent to the protuberances; 14a designates an external connection terminal; 14b designates a solder film, such as solder, formed so as to cover the external connection terminal 14a; and 8 designates agglomerate.

In the contact 1 according to the 4th embodiment, if, as shown in FIG. 12, the irregularities 7 are formed on the surface of the tip end 3, the protuberances 7a are engaged in the surface of the solder film 14b on the external connection terminal 14a, thereby breaking an oxide film which is present on the surface of the solder film 14b and increasing a contact area between the protuberance 7a and the solder film 14b. Since a plurality of protuberances 7a are present on the tip end 3, there can be ensured a sufficient contact area between the protuberances 7a and the solder film 14b without involvement of relative sliding motion, which results from horizontal movement of the contact 1. Accordingly, an electrical signal can be transmitted/received by way of the contact 1. In other words, good electrical contact can be ensured for a long period of time while there is minimized formation of agglomerate, which would otherwise be caused by means of the protuberances 7a scraping the solder film 14b on the external connection terminal 14a.

In the present embodiment, formation of agglomerate, which would otherwise be caused by sliding action of the known contact, is minimized. However, when the protuberances 7a formed on the tip end 3 of the contact 1 are engaged with the solder film 14b, the agglomerate 8—which is an aggregation of solder or oxide scraped from the solder film 14b—is displaced into the recesses 7b. In the present embodiment, the agglomerate 8 is locally deposited in a trace amount. Deposition of the agglomerate 8 is described in comparison with the agglomerate 8 which is deposited on the known contact, by reference to FIGS. 14A and 14B. As shown in FIG. 14B, the agglomerate 8 is deposited substantially over the entire tip end 3 which is to be brought into contact with an external connection terminal. The contact would fail to establish good electrical contact with an external connection terminal before long. In contrast, in the contact 1 according to the present embodiment, the agglomerate 8 is accumulated in the recesses 7b. As shown in FIG. 14A, the agglomerate 8 is scarcely present in the contact area where the contact 1 is in contact with the external connection terminal 14a. Even in a case where the agglomerate 8 is deposited on the tip end 3 through tests, the plurality of protuberances 7a can ensure electrical contact. Further, since relative sliding action, which would otherwise arise between the contact 1 and the external connection terminal 14a, is minimized, and hence agglomerate 8 is deposited in small amount. Thus, stable electrical contact can be established between the external connection terminal 14a and the contact 1 for a long period of time.

The geometry of the irregularities 7 formed on the surface of the tip end 3 according to the present embodiment will now be described. In order to ensure a contact area most efficiently, the curvature radius R of the top of the protuberance 7a is preferably set so as to assume substantially the same value as the thickness of the outermost layer of the external connection terminal 14a; that is, the thickness of the solder film 14b. A cavity formed by combination of the protuberances 7a and the recesses 7b is filled with the agglomerate 8 soon, if the cavity has a shallow depth D. For this reason, the depth D of the cavity is preferably set so as to assume a thickness which is greater than the thickness of the outermost layer on the external connection terminal. In fact, the curvature radius R of the top of the protuberance 7a is preferably set so as to assume a value of about 10 μm, and the depth D of the cavity formed by combination of the protuberances 7a and the recesses 7b is preferably set so as to assume a value of about 20 μm. If the irregularities are formed from smoothly-curved surfaces of, for example, 0.2 μmRy or thereabouts, the agglomerate 8 preferably becomes more slippery, to thereby prevent deposition of the agglomerate 8.

FIG. 12 shows an example in which the irregularities 7 are formed in the surface of the tip end 3 having a roundly-pointed head. The same advantageous result can be yielded even when irregularities are formed in the surface of the hemi-spherical head of the tip end 3 shown in FIG. 10 or when irregularities are formed in the surface of the tip end 3 whose head is formed from smooth corrugations, as shown in FIG. 11.

(7th Embodiment)

FIG. 15 is a cross-sectional view showing irregularities formed in a tip end of a contact belonging to a test socket according to a 7th embodiment of the present invention. In the drawing, reference numeral 7a designates protuberances of the irregularities 7; 7b designates recesses; and 9 designates a conductive solder-resistant agglomerate member formed on the surface of the protuberances 7a.

In the contact (the entirety thereof is not shown) having the foregoing structure, the solder-resistant conductive agglomerate member 9 having a thickness of about 1 μm is formed on the protuberances 7a of the irregularities 7 formed on the tip end 3. The agglomerate 8, such as solder chippings, can be prevented from coagulating. Any substance may be employed as the solder-resistant conductive agglomerate member 9, so long as the substance has low chemical affinity for solder. For example, chromium, tungsten, titanium nitride, and diamond-like carbon containing graphite components in high proportion are particularly preferable. The surface of the irregularities 7 of the tip end 3 can be coated with chromium, by means of the plating technique or the vapor-phase composition technique.

Figure 10:
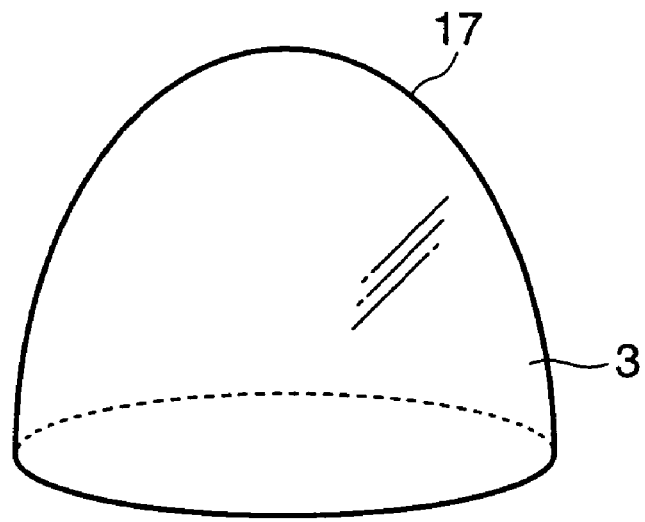
FIG. 10 is a perspective view showing a contact of another test socket according to the 4th and the 17th embodiments of the present invention.

The present embodiment has described an example in which the solder-resistant conductive agglomerate member 9 is formed on the irregularities 7 on the tip end 3. Adhesion of solder to the tip end 3 of the contact 1 can be prevented by means of forming the solder-resistant conductive agglomerate member 9 on the surface of the tip end 3 which is shown in FIG. 8 and has a roundly-pointed head, the tip end 3 which is shown in FIG. 10 and has a substantially hemi-spherical head 17, or the tip end 3 which is shown in FIG. 11 and has a smoothly-corrugated cross section (corrugations 18).

(8th Embodiment)

Figure 16:
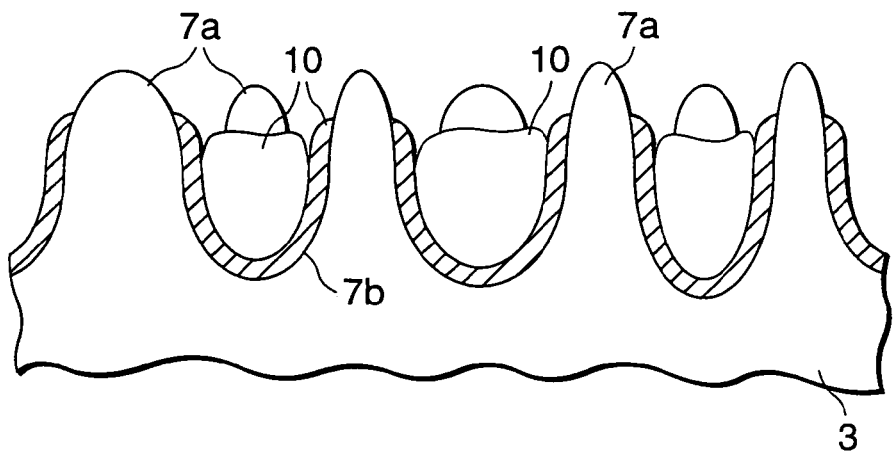
FIG. 16 is a cross-sectional view showing irregularities formed in a tip end of a contact belonging to a test socket according to an 8th and a 21st embodiment of the present invention.

FIG. 16 is a cross-sectional view showing irregularities formed on a tip end of a contact belonging to a test socket for testing an electronic device or a semiconductor package according to an 8th embodiment of the present invention. In the drawing, reference numeral 7a designates protuberances of the irregularities 7; 7b designates recesses; and 10 designates a solder-resistant non-conductive agglomerate member which is formed on the surface of the protuberances 7a.

In the contact 1 having such a structure (the entirety of the contact 1 is not shown), the solder-resistant non-conductive agglomerate member 10 having a thickness of, for example, about 1 μm is formed on the protuberances 7a of the irregularities 7 formed on the tip end 3, thereby preventing agglomeration of solder chippings into the agglomerate 8. Any substance may be employed as the solder-resistant non-conductive agglomerate member 10, so long as the substance has low chemical affinity for solder. For example, diamond or diamond-like carbon containing graphic components in low proportion is particularly preferable. The solder-resistant non-conductive agglomerate member 10 can be formed on the surface of the irregularities 7 formed on the tip end 3 by means of the vapor-phase composition technique. In order to ensure establishment of electrical contact between the tip end 3 and the external connection terminal 14a or a coating film formed on the external connection terminal 14a, the contact is subjected to oxygen plasma etching after a coating film has been formed on the tip end 3, to thereby remove a non-conductive film from an electrical connection section. Further, a portion of the surface of the irregularities 7 of the tip end 3, which portion is to act as an electrical connection section, may be covered with a resist film at the time of formation of the solder-resistant non-conductive agglomerate member 10.

The present embodiment has described an example in which the solder-resistant nonconductive agglomerate member 10 is formed on the irregularities 7 on the tip end 3. Adhesion of solder to the tip end 3 of the contact 1 can be prevented by means of forming the solder-resistant nonconductive agglomerate member 10 on the surface of the tip end 3 which is shown in FIG. 8 and has a roundly-pointed head, the tip end 3 which is shown in FIG. 10 and has a substantially hemi-spherical head 17, or the tip end 3 which is shown in FIG. 11 and has a smoothly-corrugated cross section (corrugations 18), while only an electrical connection section remains uncovered with the solder-resistant nonconductive agglomerate member 10.

(9th Embodiment)

The process of producing the contact 1 in which the irregularities 7 are formed in the tip end 3 according to the 6th embodiment, comprises a first step of punching material having the property of a spring by means of pressing, to thereby define the profile of a contact; a second step of forming irregularities in the portion of the thus-punched member, which portion is to come into contact with an external connection terminal; and a third step of coating the thus-punched member having the irregularities formed thereon.

Figure 17:
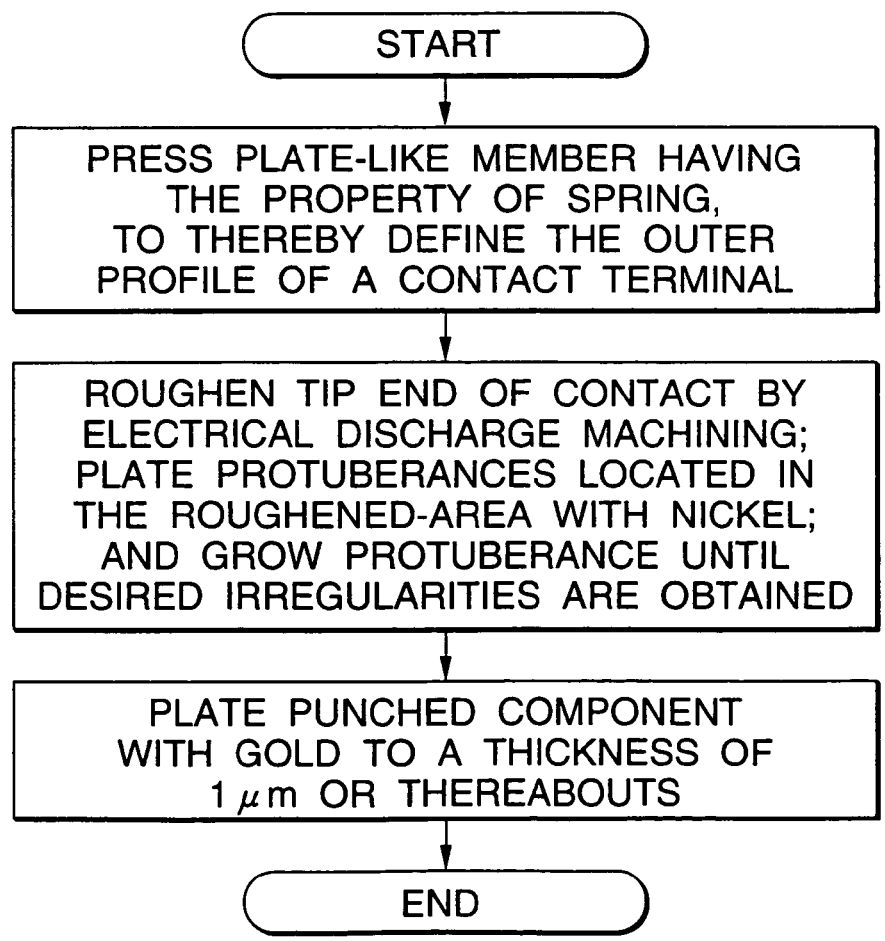
FIG. 17 is a flowchart showing specific example steps of a method of manufacturing a test socket according to a 9th embodiment of the present invention.

FIG. 17 is a flowchart showing specific example steps of a method of manufacturing a test socket for use in testing an electronic device or semiconductor package according to a 9th embodiment of the present invention. For example, a plate-like material having the property of a spring and a thickness of several hundreds of micrometers, such as beryllium copper or phosphor bronze, is pressed, to thereby define the profile of the contact terminal 1. The tip end 3 of the contact 1 is made rough by means of any one of the electric discharge machining technique, the sand blasting technique, the liquid honing technique, and the etching technique. Protuberances formed in the thus-roughened surface of the tip end 3 are subjected to electrolytic nickel plating, and a solder film is grown until desired irregularities are formed. The thickness of the solder film is preferably determined by means of the degree of a roughening operation. The thickness of the solder film preferably assumes a value of 5 to 20 µm or thereabouts. Further, the thus-punched member which has been plated is subjected to gold plating to a thickness of about 1 µm, to thereby prevent oxidation of the contact. Through the foregoing steps, there can be readily manufactured the contact 1 comprising:

the tip end 3 to be brought into contact with an external connection terminal of an electronic device or a semiconductor package;

the plurality of resilient sections 2 which are joined together and bent so as to extend horizontally with respect to the tip end;

the support section 6 joined to the plurality of resilient sections;

the base 4 which is connected to the support section 6 and positions a test socket;

the terminal section 5 which is connected to the base 4 and is to be connected to a test circuit board;

the plurality of protuberances 7a which are formed in the tip end 3 from smoothly-curved surfaces; and the plurality of recesses 7b which are adjacent to the protuberances 7a and formed from smoothly-curved surfaces.

In the present embodiment, the tip end 3 of the contact 1 is made rough by means of electric discharge machining, and protuberances which are present in the thus-roughened area are plated with nickel. Through the steps according to the present embodiment, a plate-like material having the property of a spring and a thickness of several hundreds of micrometers, such as beryllium copper or phosphor bronze, is pressed, to thereby define the profile of the contact terminal 1. The tip end 3 is plated with cobalt, thereby producing a granular member having a diameter of about 20 µm. Thus, desired irregularities can be formed in the tip end 3 without involvement of an electric discharge machining operation as preliminary treatment.

The present embodiment has described an example manufacturing method of forming substantially-spherical irregularities 7 on the tip end 3. In order to transform the irregularities 7 formed on the tip end 3 according to the 6th embodiment into the corrugations 18 having smoothly-curved cross sections, the irregularities 7 are formed through electric discharge machining or coining.

The present embodiment has not described a manufacturing method of forming material having an agglomeration-resistant property over the irregularities 7 formed on the tip end 3 described in connection with the 7th embodiment. According to the manufacturing method by which the solder-resistant conductive agglomerate member 9 is formed on the irregularities on the tip end 3, the solder-resistant conductive agglomerate member 9 is formed by means of plating or the vapor-phase composition technique, such as the PVD or CVD technique, in a step subsequent to the step in which the tip end 3 has been plated with nickel. Further, in a subsequent step, the tip end 3 is plated with gold for preventing oxidation f the contact 1. In order to prevent the solder-resistant conductive agglomerate member 9 from being coated with gold, a resist film is provided on the tip end 3.

According to the manufacturing method under which the solder-resistant nonconductive agglomerate member 10 according to the 8th embodiment is provided on the irregularities 7 on the tip end 3, the solder-resistant nonconductive agglomerate member 10 is formed by means of the vapor-phase composition technique, such as PVD or CVD, in a step subsequent to the step of plating the tip end 3 with electrolytic nickel. The tip end 3 is subjected to oxygen plasma etching in a subsequent step. In order to ensure electrical connection, the solder-resistant nonconductive agglomerate member 10 is removed from the tip end of the irregularities 7. Ina subsequent step, the tip end 3 is plated with gold. In order to prevent the solder-resistant nonconductive agglomerate member 10 from being plated with gold, a resist film is provided on the tip end 3.

(10th Embodiment)

Figures 18, 19:
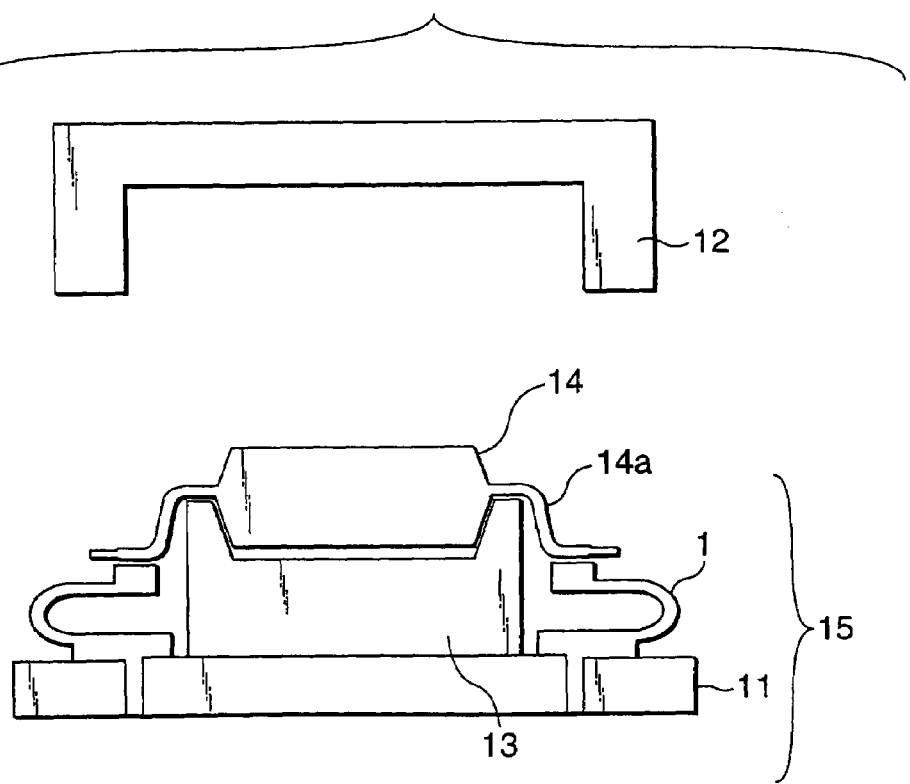
FIG. 18 is a table showing a fraction defective of semiconductor packages which are tested through use of the three types of contacts employed in a 10th embodiment of the present invention.
FIG. 19 is a cross-sectional view showing a known test socket.
Figure 20:
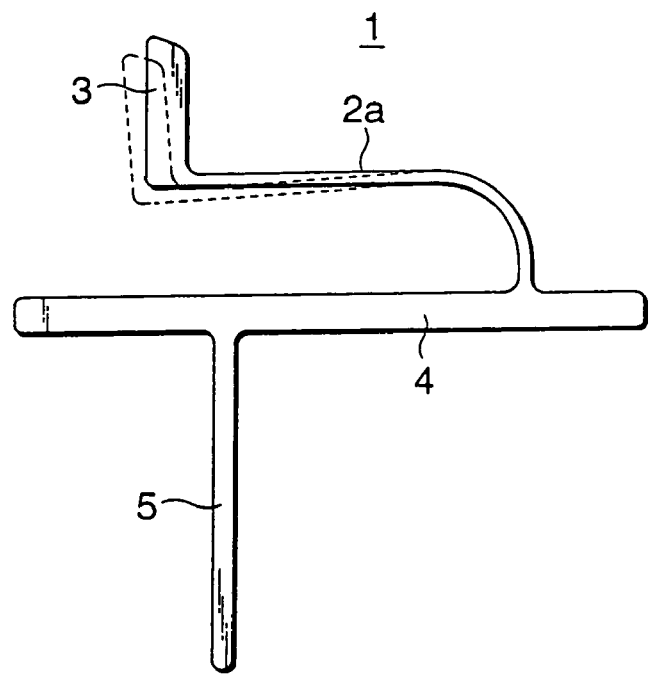
FIG. 20 is a cross-sectional view showing another known test socket.
Figure 21:
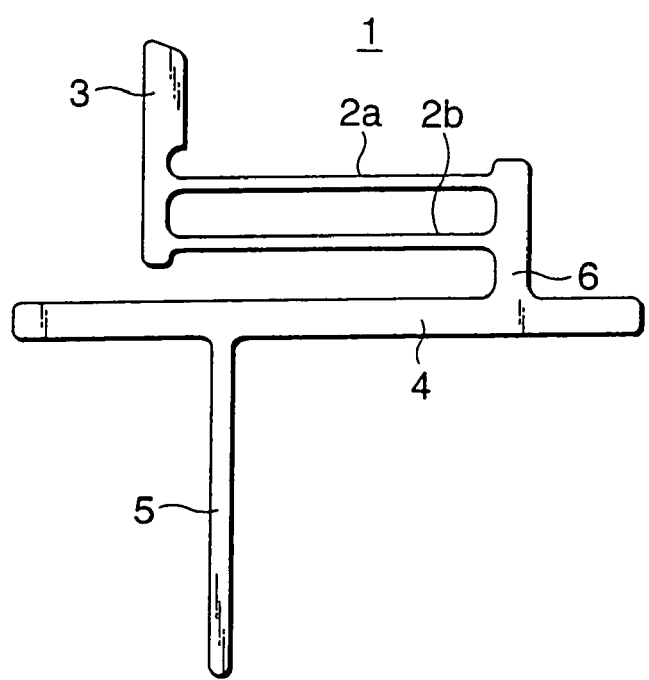
FIG. 21 is a cross-sectional view showing yet another known test socket.
Figure 22:
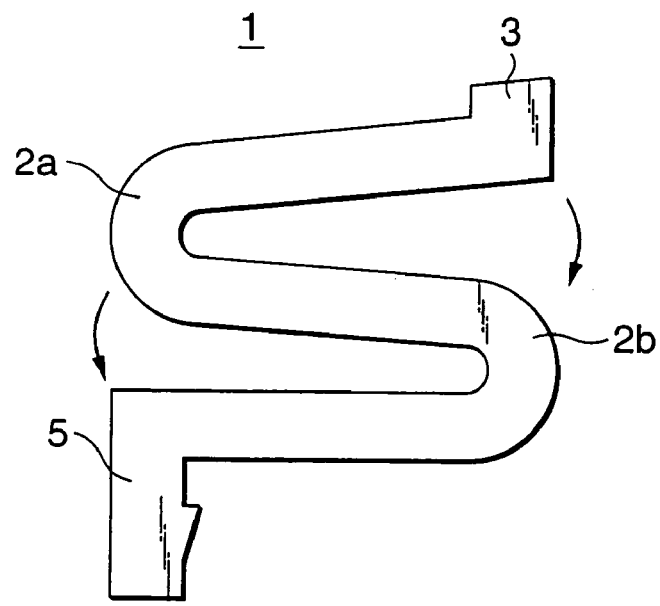
FIG. 22 is a cross-sectional view showing still another known test socket.
Figure 23:
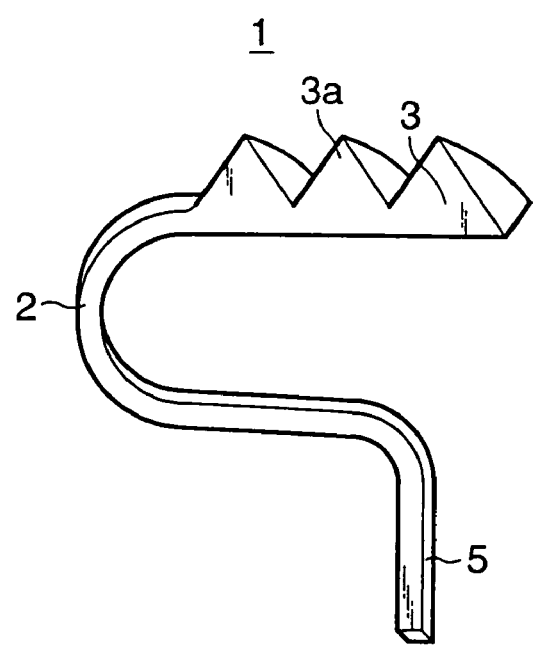
FIG. 23 is a cross-sectional view showing another known test socket.

There is made comparison among the contact A of the test socket according to the 5th embodiment which is shown in FIG. 12 and in which the irregularities 7 are formed in the tip end 3, the contact B according to the 3rd embodiment, and the known contact C shown in FIG. 20. FIG. 18 is a table showing a fraction defective of semiconductor packages which are tested through use of the three types of contacts;

A, B, and C. A lot is divided into three groups for the respective contacts A, B, and C, each group comprising about 3000 electronic devices or semiconductor packages 14. A certain IC included in respective electronic device or semiconductor package 14 is tested through use of the contacts A, B, and C. The fraction defective detected by the contact A is reduced to one-fifth the fraction defective detected by the known contact C. Further, the fraction defective detected by the contact B is reduced to one-second the fraction defective detected by the known contact C. The reason why the fraction defective detected by the known contact C has a large value is conceived to be attributable to the following situation: Namely, the electronic device or semiconductor package 14 is tested while the agglomerate 8 is interposed between the tip end 3 of the contact 1 and the external connection terminal 14a, to thereby hinder establishment of good electrical contact between the external connection terminal 14a and the tip end 13. As a result, an electronic device or semiconductor package 14 is determined to be defective even through the electronic device or semiconductor package 14 is actually non-defective. In order to compare the three types of contacts with one another in terms of the length of life, the contacts A, B, and C are compared with one another with regard to maintenance from the view point of frequency of replacement, provided that contact resistance of 1 Ω or more is detected as a result of an increase in the area on the contact surface in which agglomerate is deposited. The tests show that the contact A is improved 10 in terms of maintenance when compared with the known contact C and that the contact B is improved four times in terms of maintenance when compared with the known contact C.

The present embodiment has described a method of testing an electronic device or semiconductor package, particularly, an IC, through use of a test socket. The method can also be used for testing a printed board or a liquid-crystal device other than an IC, by means of bringing a contact according to the present invention into contact with an external connection terminal of a printed board or liquid-crystal device.

(11th Embodiment)

By means of the test described in connection with the 10th embodiment, flaws formed in the surface of the external connection terminal 14a of the semiconductor package 14, which flaws are formed by the contact A according to the 5th embodiment, the contact B according to the 3rd embodiment, and the known contact C shown in FIG. 20. No substantial flaws are found in the external connection terminal which is tested by the contact terminal A. Small flaws of about 10 μm are found in the external connection terminal which is tested by the contact B. Large flaws of several hundreds of micrometers are found in the external connection terminal which is tested by the contact C. It could be ascertained that flaws, which would be formed in an external connection terminal by a contact, can be made small by means of preventing horizontal sliding action of the contact.

The present invention having the foregoing structure yields the following advantages.

A plurality of resilient sections are connected to a tip end which is to be brought into contact with an external connection terminal of a contact belonging to a test socket of an electronic device or semiconductor package. The resilient sections are bent so as to extend in opposite directions horizontally with respect to the tip end. The force exerted downward on the tip end is equally distributed between the plurality of resilient sections. The resilient sections are eventually deflected downwardly without involvement of horizontal sliding action. The force which is exerted on the tip end in reaction to the downward deflection of the curved portions brings the tip end 3 into pressing contact with the external connection terminal 14a.

There can be prevented scraping of a member constituting the external connection terminal or formation of oxides on the external connection terminal, which would otherwise be caused when relative sliding movement arises between the tip end and the external connection terminal. Accordingly, there can be prevented generation and accumulation of agglomerate on the surface of the tip end. The present invention yields an advantage of ability to effect a highly-reliable test for a long period of time. Further, the present invention prevents electrical shortcircuit, which would otherwise be caused when agglomerate deposited on the tip end comes off from the tip end and the thus-exfoliated agglomerate flakes affix to an external connection terminal.

So long as the plurality of resilient sections are formed so as to differ in thickness or length from one another or another resilient section is added to the resilient sections which are opposed, one of the resilient sections is made so as to slightly differ in rigidity from the other resilient section, thereby imparting a trace amount of horizontal sliding action to the tip end 3. Even in a case where electrical contact is difficulty to establish because of presence of a thick oxide film on the external connection terminal, electrical connection can be established unfailingly. Further, the amount of horizontal sliding action is minimized, and there can be prevented formation and deposition of agglomerate on the surface of the tip end to be brought into contact with an external connection terminal of an electronic device or semiconductor package. Therefore, a highly-reliable test an be effected for a long period of time.

A substantially hemi-spherical or roundly-pointed head is formed at the head of the tip end to be brought into contact with an external connection terminal of an electronic device or semiconductor package. Further, a curvature radius of the tip end is set so as to assume a value of 0.3 mm or less. Consequently, contact resistance arising between an external connection terminal and a tip end can be made small, as a result of which a highly-reliable test can be effected for a long period of time.

The tip end to be brought into contact with an external connection terminal of an electronic device or semiconductor package is formed so as to assume a smooth corrugated cross section, and the curvature radius of the tip end is particularly set so as to assume a value of 0.3 mm or less. As a result, contact resistance arising between an external connection terminal and a tip end can be made small, as a result of which a highly-reliable test can be effected for a long period of time.

A plurality of protuberances formed from smoothly-curved surfaces and a plurality of recesses which are adjacent to the protuberances and formed from smoothly-curved surfaces are formed in the tip end to be brought into contact with an external connection terminal of an electronic device or semiconductor package. As a result, the protuberances are engaged with a solder film covering the external connection terminal. Thus, the tip end can be brought into contact with the external connection terminal without fail. Agglomerate resulting from the protuberances engaging with the solder film can be eliminated into the recesses. Although the agglomerate is deposited into the recesses in trace amount, contact between the external connection terminal and the tip end can be ensured at all times by means of the plurality of protuberances, thereby enabling stable electrical connection for a long period of time.

Further, a agglomerate-resistant member is provided on the tip end to be brought into contact with an external connection terminal of an electronic device or semiconductor package or on the irregularities on the tip end. As a result, agglomeration of agglomerate, such as a trace amount of solder chippings, can be prevented. Further, the present invention yields an advantage of prolonging the life of a test socket.

The agglomerate-resistant member is selected from the group comprising chromium, tungsten, titanium nitride, and diamond-like carbon containing graphite components in high proportion. Presence of the agglomerate-resistant member makes extremely low chemical affinity of solder for a tip end to be brought into contact with an external connection terminal of an electronic device or semiconductor package or for irregularities formed on the tip end. Consequently, agglomerate becomes difficult to adhere to the tip end. Thus, the present invention yields an advantage of prolonging the life of a test socket.

The agglomerate-resistant member is selected from either diamond-like carbon containing graphite in low proportion or diamond. The agglomerate-resistant member is provided on the tip end other than the area where the tip end establishes electrical connection with an external connection terminal. Presence of the agglomerate-resistant member makes extremely low chemical affinity of solder for a tip end to be brought into contact with an external connection terminal of an electronic device or semiconductor package or for irregularities formed on the tip end. Thus, the present invention yields the same advantage as that mentioned above.

The present invention employs a manufacturing method comprising the steps of:

punching material so as to define the profile of a contact of a test socket belonging to an electronic device or semiconductor package;

roughening a tip end to be brought into contact with an external connection terminal of an electronic device or semiconductor package, by means of electric discharge machining;

plating the thus-roughened punched socket with nickel; and plating the socket with gold.

As a result, there can be readily and inexpensively effected defining of a required profile, formation of irregularities in the tip end, and formation of an oxide film. There can be manufactured the test socket.

Since the contact of the test socket of an electronic device or semiconductor package can establish electrical contact stably and continuously with an external connection terminal of the electronic device or semiconductor package, the reliability of electrical test of an electronic device or semiconductor package can be improved. Further, since the test socket can be used over a long period of time, the present invention yields an advantage of reducing the frequency of replacement of a test socket, thereby improving the maintenance characteristic of a test socket, Since the electronic device or semiconductor package is tested through use of the contact without involvement of horizontal sliding action of the tip end or with involvement of a trace amount of horizontal sliding action of the tip end, the present invention yields an advantage of ability to reduce flaws, which would otherwise arise in the external connection terminal as a result of the contact comes into contact with the external connection terminal. Further, the present invention prevents occurrence of an electrical shortcircuit, which would otherwise be caused when flakes of agglomerate coming off from the tip end adheres to an external connection terminal. The present invention also prevents occurrence of a failure, which would otherwise be caused by the agglomerate adhering to the external connection terminal at the time of mounting of a semiconductor package.

(12th Embodiment))

Figure 24:
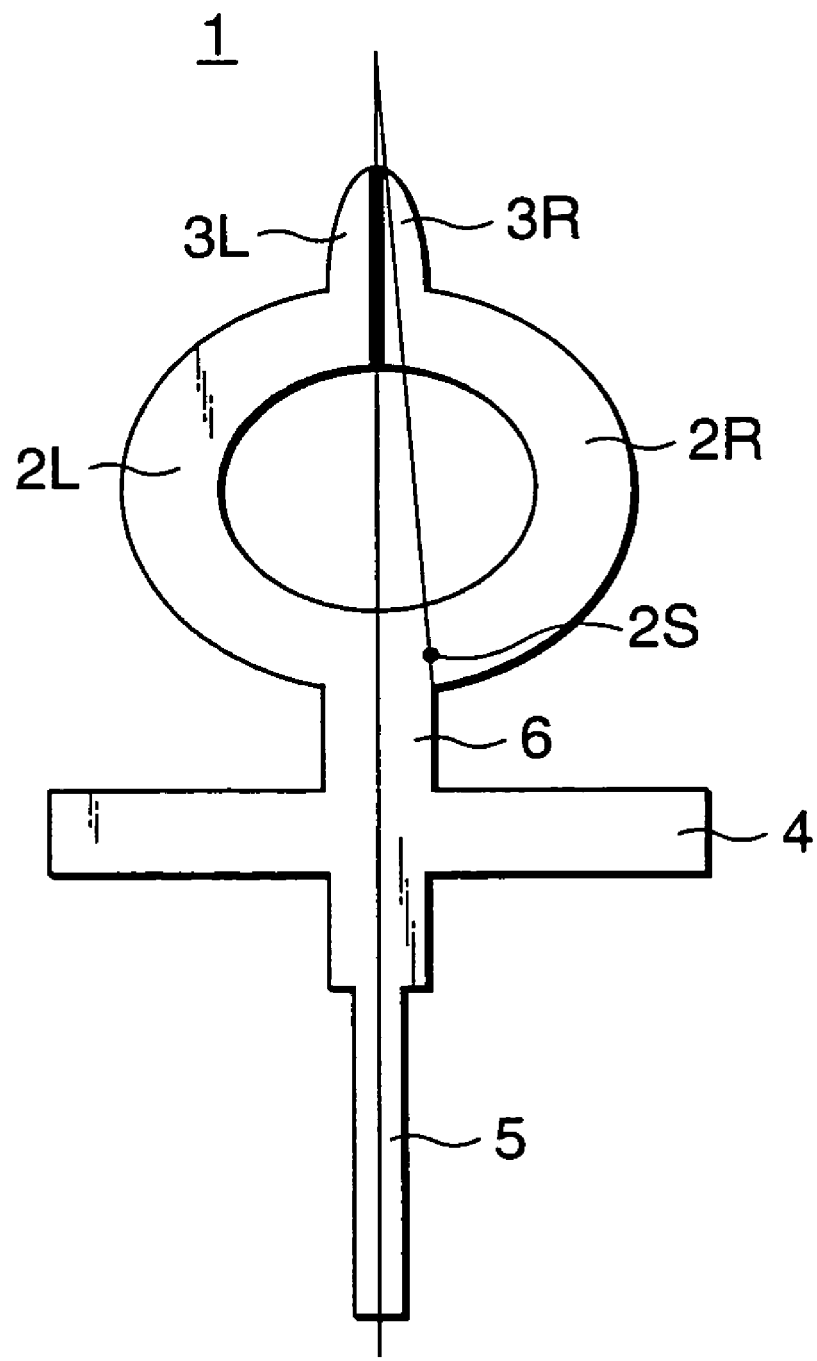
FIG. 24 is a front view showing a contact of a test socket according to the 12th embodiment of the present invention.

Preferred embodiments of the present invention will be described hereinbelow by reference to the accompanying drawings. FIG. 24 is a front view showing the structure of a contact of a test socket according to a 12th embodiment of the present invention. In the drawings, reference numeral 1 designates a contact; 2L and 2R designate resilient sections; 3L and 3R designate tip ends to be brought into contact with an external connection terminal of a member to be tested (hereinafter referred to simply as a "member"), such as an electronic device or semiconductor package; 4 designates a base; 5 designates a terminal to be connected with a test circuit board; and 6 designates a support.

The contact 1 of the test socket has a free end to be brought into contact with the external connection terminal 14a of the semiconductor package 14, the free end being split into two tip ends 3L and 3R. The tip end 3L is connected to a resilient section 2L, and the tip end 3R is connected a resilient section 2R, the resilient section 2L differing from the resilient section 2R. The two resilient sections 2L and 2R are connected to a single support section 6, and the base 4 to be used for positioning a test socket extends horizontally from the support section 6. The terminal 5 to be connected to a test board is connected to a lower portion of the support section 6.

An external connection terminal 14a of the member is placed on the tip ends 3L and 3R, and an unillustrated press jig is pressed against the external connection terminal 14a. The force exerted downward on the tip ends 3L and 3R is substantially equally distributed between the two resilient sections 2L and 2R which are provided opposite to each other and are curved so as to extend horizontally with respect to the tip ends 3L and 3R. The two resilient sections 2L and 2R are deflected downwardly, and the force which is exerted on the tip ends 3L and 3R in reaction to the downward deflection of the two resilient sections 2L and 2R brings the tip ends 3L and 3R into pressing contact with the external connection terminal 14a. At this time, the resilient section 2R is deflected around a fulcrum 2S at which the resilient section 2R is connected to the support section 6, wherewith the tip end 3R attempts to cause horizontal movement toward the other tip end 3L. Similarly, force acts on the tip end 3L so as to cause horizontal movement toward the tip end 3R. Consequently, the tip ends 3L and 3R are pressed against each other and cause relative sliding action with respect to the external connection terminal 14a over a distance corresponding to a clearance defined between the tip ends 3L and 3R, as a result of which scraping of a member constituting the external connection terminal 14a or oxides formed on the external connection terminal 14a arises in a smaller amount. Accordingly, there can be prevented generation and accumulation of agglomerate on the surfaces of the tip ends 3L and 3R.

Figure 25:
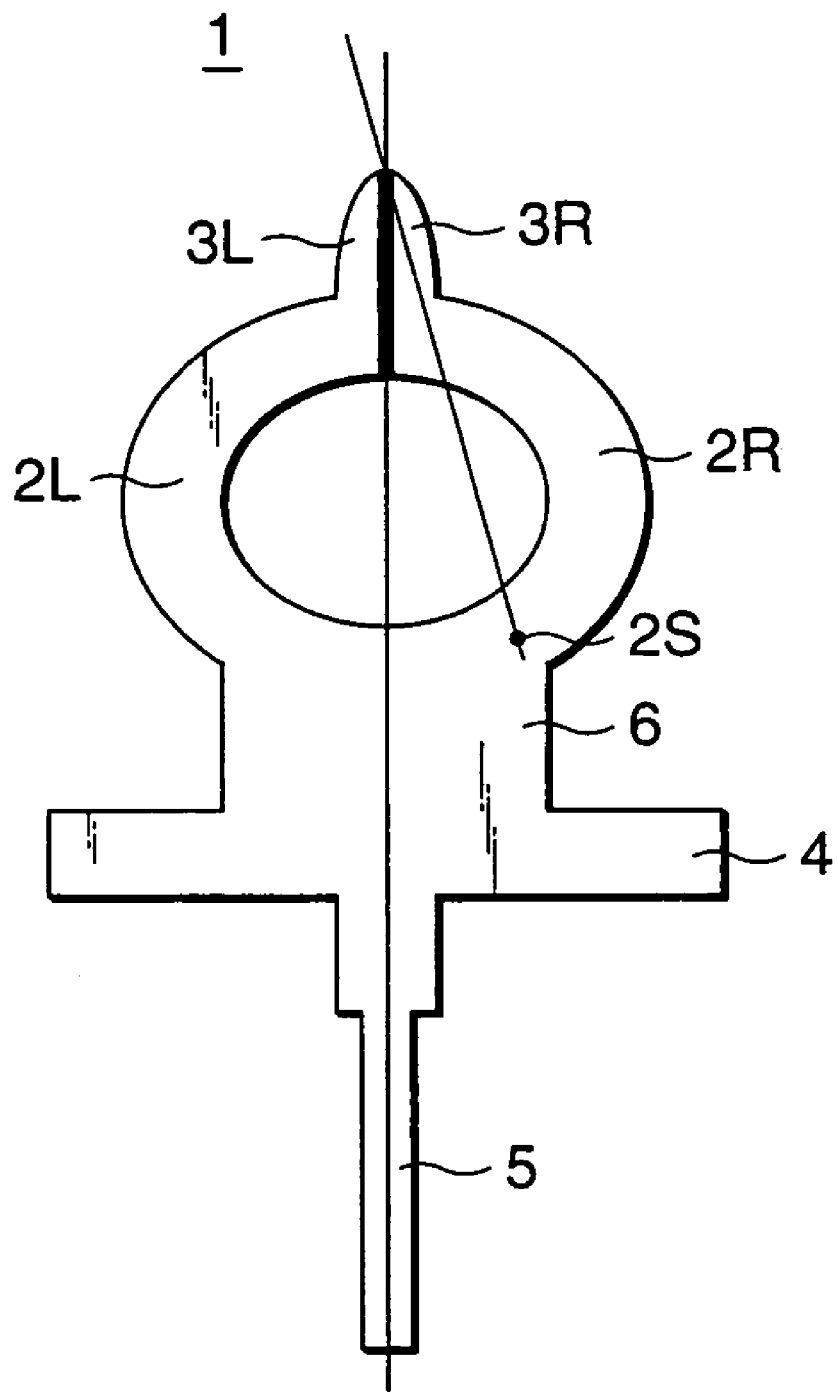
FIG. 25 is a front view showing a contact of another test socket according to the 12th embodiment.

The force exerted on the tip ends 3L and 3R in a direction in which they are pressed against each other can be changed by means of changing the position of the fulcrum 2S. For instance, so long as the width of the support section 6 is increased, as shown in FIG. 25, pressing force can be increased.

(13th Embodiment))

Figure 26A:
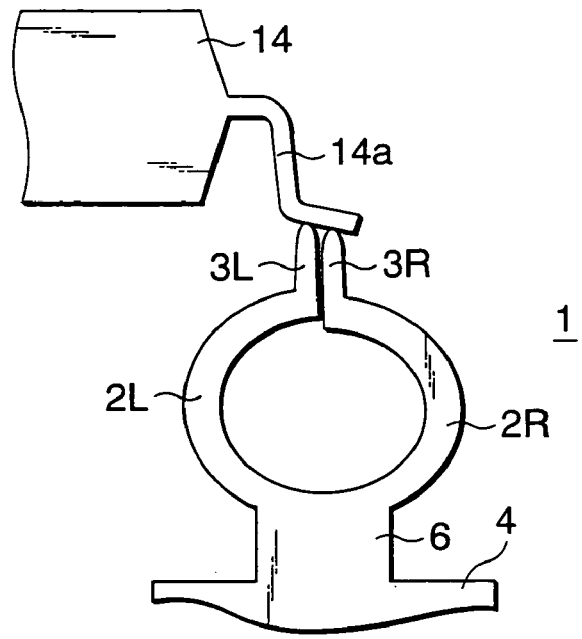
FIGS. 26A and 26B are front view showing a contact of a test socket according to a 13th embodiment of the present invention.
Figure 26B:
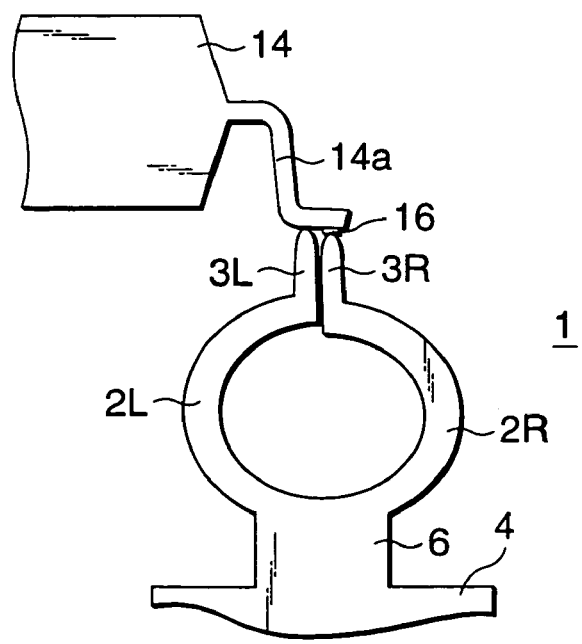

FIGS. 26A and 26B are front views showing the structure of a contact of a test socket according to a 13th embodiment of the present invention. In the drawing, reference numeral 1 designates a contact; 2L and 2R designate resilient sections; 3L and 3R designate tip ends; 4 designates a base; 6 designates a support; 14 designates a semiconductor package; and 14*a* designates an external connection terminal.

The present embodiment describes the operation of the contact of the test socket according to the 12th embodiment. There may be a case where the external connection terminal 14*a* is not formed horizontally and presses the tip end 3R downwardly to a position lower than that of the tip end 3L. Further, there may be a case where a resin chipping 16 is attached to the external connection terminal 14*a* and where the resin chipping 16 is caught between the external connection terminal 14*a* and the tip end 3R, as shown in FIG. 26B. The tip end of the contact 1 of the test socket is split into the tip ends 3L and 3R, with the tip end 3L being connected to the resilient section 2L, and the tip end 3R being connected to the resilient section 2R. By means of such a structure of the tip end, the resilient section 2R causes downward deflection faster than the resilient section 2L, wherewith the tip end 3R is moved toward the tip end 3L. As mentioned in the 12th embodiment, the tip ends 3L and 3R are pressed against each other, and hence the tip end causes only a trace amount of horizontal movement. In other words, the tip ends 3L and 3R do not cause any substantial relative sliding action with respect to the external connection terminal 14*a*. Scraping of a member constituting the external connection terminal 14*a* or oxides formed on the external connection terminal 14*a* can be suppressed, and hence there can be prevented generation and accumulation of agglomerate on the surfaces of the tip ends 3L and 3R. Even if the resin chipping 16 is caught between the external connection terminal 14*a* and the tip end 3L or 3R, to thereby hinder establishment of electrical connection, establishment of electrical connection is ensured by the remaining tip end, because the tip end is split into the tip ends 3L and 3R.

(14th Embodiment))

Figure 27:
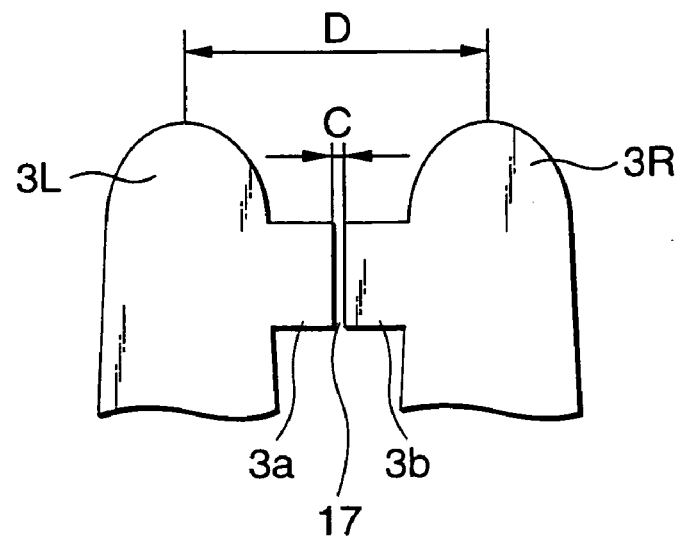
FIG. 27 is a front view showing a contact of a test socket according to a 14th embodiment of the present invention.

FIG. 27 is a front view showing the tip end of a contact of a test socket according to a 14th embodiment of the present invention. In the drawings, reference numeral 3L and 3R designate tip ends; 3*a* designates a side protuberance projecting from the tip end 3L; 3*b* designates a side protuberance projecting from the tip end 3R; and 17 designates a clearance defined between the side protuberances 3*a* and 3*b*.

In the present embodiment, the contact 1 of the test socket has a free end to be brought into contact with the external connection terminal 14*a* of the semiconductor package 14, the free end being split into two tip ends 3L and 3R. The tip end 3L has the side protuberance 3*a*, and the tip end 3R has the side protuberance 3*b*. The side protuberances 3*a* and 3*b* are oriented opposite to each other, and the clearance 17 is defined between the side protuberances 3*a* and 3*b*. When the external connection terminal 14*a* is brought into contact with the tip ends 3L and 3R of the test socket, resilient sections cause deflections, and the restoration force of the resilient sections brings the tip ends 3L and 3R into contact with the external connection terminal 14*a*, as in the case of the 12th embodiment. In a case where force is exerted on the tip ends 3L and 3R in a direction in which the tip ends 3L and 3R are pressed against each other, the side protuberances 3*a* and 3*bb* are brought into collision with each other. The distance over which the tip ends 3L and 3R are horizontally moved is determined by the dimension of the clearance C, thereby determining the amount of sliding action arising between the contact and the external connection terminal. If the dimension of the clearance C shown in FIG. 27 is set to a value of 20 μm or thereabouts, the amount of horizontal movement of the tip ends 3L and 3R can be made smaller than that achieved by the known test socket. A trace amount of horizontal movement is imparted to the tip ends 3L and 3R, and hence electrical connection can be established without fail even when a thick oxide film covering the external connection terminal imposes difficulty in establishing electrical connection between the external connection terminal and the tip ends 3L and 3R. Provided that the interval between the tip ends 3L and 3R (designated by dimension D shown in FIG. 26) is set to a value of about 200 μm, electrical contact can be established between an external connection terminal and either of the tip ends, even if the length of an external connection terminal varies. Thus, there can be prevented occurrence of disconnection between the external connection terminal and the contact.

(15th Embodiment))

Figure 28:
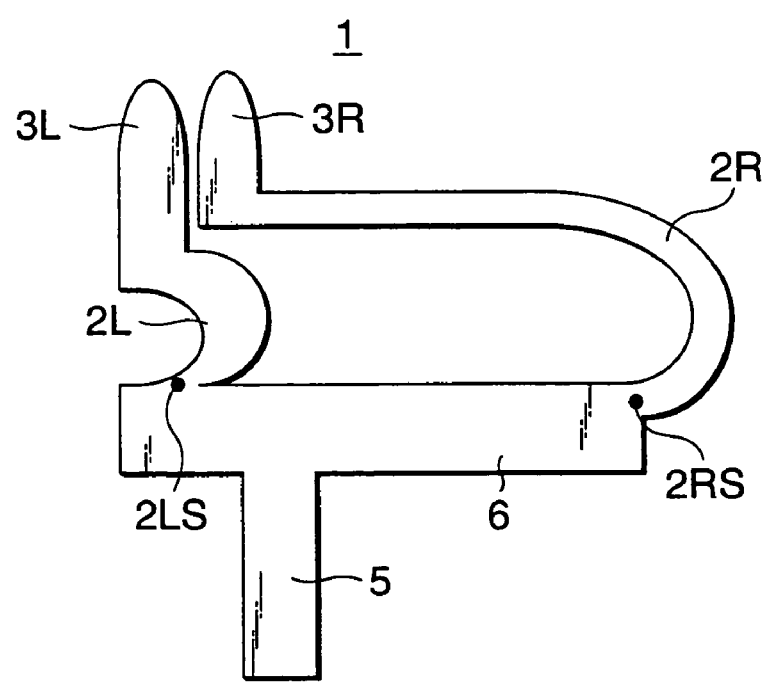
FIG. 28 is a front view showing a contact of a test socket according to a 15th embodiment of the present invention.

FIG. 28 is a front view showing the structure of a contact of a test socket according to a 15th embodiment. In the drawing, reference numeral 1 designates a contact; 2L and 2R designate resilient sections; 3L and 3R designate tip ends; 5 designates a terminal; and 6 designates a support section.

The contact 1 of the test socket has a free end to be brought into contact with the external connection terminal 14*a* of the semiconductor package 14, the free end being split into two tip ends 3L and 3R. The tip end 3L is connected to the resilient section 2L, and the tip end 3R is connected to the resilient section 2R. The resilient sections 2L and 2R are connected to the single support section 6. The support section 6 doubles as a horizontally-extending base which is to be used for positioning the test socket. The terminal 5 to be connected to a test board is attached to the support section 6.

In the contact 1 of the test socket, the resilient sections 2L and 2R are not bent so as to extend horizontally, unlike the 12th embodiment. The resilient sections 2L and 2R are asymmetrical. The only requirement is to ensure only a space for one resilient section. This test socket is effective for reducing the distance between the seat 13 of the test socket shown in FIG. 19 and the tip ends 3L and 3R of the contact 1 which are brought into contact with the external connection terminal 14*a*. When force is applied to the external connection terminal 14*a* from above while the tip ends 3L and 3R are brought into contact with the external connection terminal 14*a*, the downward force exerted on the tip end 3L causes substantially-vertical deflection of the resilient section 2L around a fulcrum 2LS. The downward force exerted on the tip end 3R causes deflection of the resilient section 2R toward the tip end 3L around a fulcrum 2RS while horizontal movement of the tip end 3R is involved. The tip end 3R comes into collision with the tip end 3L, thereby preventing involvement of any further horizontal movement. Scraping of a member constituting the external connection terminal 14*a* or oxides formed on the external connection terminal 14*a* can be suppressed, and hence there can be prevented generation and accumulation of agglomerate on the surfaces of the tip ends 3L and 3R.

In the present embodiment, the difference between the height of the tip end 3L and that of the tip end 3R is not specified. The resilient section 3R is lower in rigidity than the resilient section 3L and causes a trace amount of deflection toward the tip end 3L involving horizontal movement. For these reasons, the position of the tip end 3R is preferably made higher than that of the tip end 3L.

(16th Embodiment))

Figure 29:
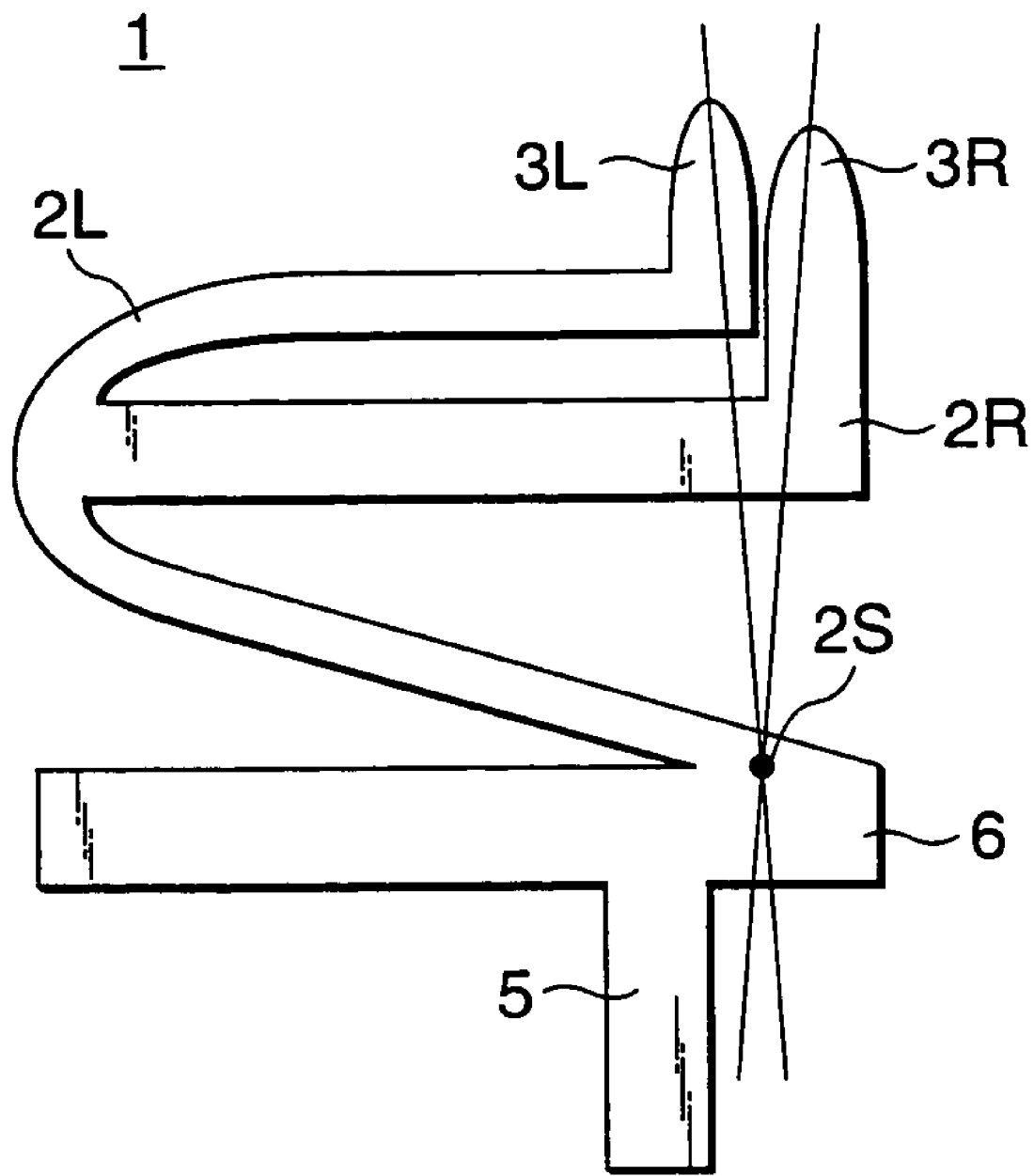
FIG. 29 is a front view showing a contact of a test socket according to a 16th embodiment of the present invention.

FIG. 29 is a front view showing the structure of a tip end of a contact of a test socket according to a 16th embodiment of the present invention. In the drawing, reference numeral 1 designates a contact; 2L and 2R designate resilient sections; 3L and 3R designate tip ends; 5 designates a terminal; and 6 designates a support section.

The contact 1 of the test socket has a free end to be brought into contact with the external connection terminal 14a of the semiconductor package 14, the free end being split into two tip ends 3L and 3R. The tip end 3L is connected to the resilient section 2L, and the tip end 3R is connected to the resilient section 2R. The resilient sections 2L and 2R are connected to the single support section 6. A vector is defined by means of interconnecting the center of the tip end 3L and a center 2S at which the resilient section 2L is connected to the support section 6. Another vector is defined by means of interconnecting the center of the tip end 3R and the center 2S at which the resilient section 2R is connected to the support section 6. These two vectors substantially match the direction in which the tip ends 3L and 3R are brought into contact with the external connection terminal 14a.

As in the case of the 15th embodiment, the contact 1 of the test socket according to the present embodiment comprises the resilient sections 2L and 2R, which are asymmetrical. The contact 1 requires only a space for a single resilient section. This test socket is effective for reducing the distance between the seat 13 of the test socket shown in FIG. 19 and the tip ends 3L and 3R of the contact 1 which are brought into contact with the external connection terminal 14a. When force is applied to the external connection terminal 14a from above while the tip ends 3L and 3R are brought into contact with the external connection terminal 14a, two vectors substantially match the direction in which the tip ends 3L and 3R are brought into contact with the external connection terminal 14a; namely, a vector defined by means of interconnecting the center of the tip end 3L and the center 2S at which the resilient section 2L is connected to the support section 6, and another vector defined by means of interconnecting the center of the tip end 3R and the center 2S at which the resilient section 2R is connected to the support section 6. Therefore, the resilient sections 2L and 2R cause substantially-vertical deflections. Further, the resilient section 2L is smaller in rigidity than the resilient section 2R. The tip end 3L comes into collision with the tip end 3R involving horizontal movement, thereby preventing involvement of any further horizontal movement. Thus, horizontal movement of the tip ends 3L and 3R can be prevented, and scraping of a member constituting the external connection terminal 14a or oxides formed on the external connection terminal 14a can be suppressed. Therefore, there can be prevented generation and accumulation of agglomerate on the surfaces of the tip ends 3L and 3R. Moreover, in the present embodiment, the two resilient section 3L is connected to the support section 6 by way of the resilient section 3R. In contrast with the 15th embodiment, the difference in rigidity between the two resilient sections 2L and 2R does not become great, thus realizing facilitated control of contact pressure of the contact 1.

In the present embodiment, the difference between the height of the tip end 3L and that of the tip end 3R is not specified. The resilient section 3L is lower in rigidity than the resilient section 3R and causes a trace amount of deflection toward the tip end 3R involving horizontal movement. For these reasons, the position of the tip end 3L is preferably made higher than that of the tip end 3R.

(17th Embodiment))

FIG. 8 is a perspective view showing a portion of a plurality of tip ends belonging to a contact of a test socket according to a 17th embodiment of the present invention. The tip end 3 is formed into a roundly-pointed head 16 having a certain thickness. A contact according to the present embodiment is formed from beryllium copper having a thickness of 0.2 mm by means of pressing, to thereby define the outer profile of the contact. After the tip end 3 had been split into two sections, the roundly-pointed head 16 is formed on each of the two tip ends through use of a brass wire such that the roundly-pointed heads 16 are of different radii of curvature. A test socket is manufactured through use of the contact, and a force of about 50 g is exerted on the tip ends of the contact from above, through use of a press jig, thereby examining the relationship between contact resistance and the curvature radii of the tip ends. FIG. 9 shows test results. The graph shown in FIG. 9 represents the relationship between contact resistance and the curvature radii of the tip ends obtained when the contact of the test socket according to the present embodiment is used. It can be ascertained that contact resistance can be suppressed when the tip end 3 is provided with the roundly-pointed head 16 having a curvature radius of about 0.3 mm or less.

Although the present embodiment has described the relationship between contact resistance and the curvature radius of the tip end obtained in the case of use of the test socket whose the tip end 3 has the roundly-pointed head 16, the same relationship can be achieved even in a case where the tip end 3 is formed into a substantially-hemi-spherical head 17. Further, the same relationship is achieved even in a case where the tip ends 3 of the contacts 1 of the test sockets described in the 13th through the 16th embodiments are formed so as to assume a substantially-hemi-spherical or roundly-pointed head.

(18th Embodiment))

FIG. 11 is a perspective view showing the structure of a portion of a plurality of tip ends belonging to a contact of a test socket according to an 18th embodiment of the present invention. Reference numeral 3 designates a tip end; and 18 designates a corrugated portion formed in a portion of the tip end 3, the corrugated portion having a smooth corrugated cross section. In a case where the curvature radius of each of the corrugations 18 is set to 0.3 mm or less, there is yielded the advantageous result yielded in the 17th embodiment is yielded.

(19th Embodiment))

FIG. 12 is a perspective view showing the structure of a portion of a plurality of tip ends of a contact belonging to a test socket according to an 19th embodiment of the present invention. FIG. 13 is an enlarged cross-sectional view showing a tip end of a contact when the tip end is in contact with an external connection terminal. FIGS. 14A and 14B are plans view showing agglomerate deposited on the tip end in comparison with the agglomerate deposited on a tip end of a contact belonging to a known test socket. In the drawings, reference numeral 3 designates a tip end (3L or 3R); 7 designates irregularities formed on the tip end 3; 7a shown in FIG. 13 designates a plurality of protuberances formed from smoothly-curved surfaces; 7b designates a plurality of smoothly-curved recesses formed adjacent to the protuberances; 14a designates an external connection terminal; 14b designates a solder film, such as solder, formed so as to cover the external connection terminal 14a; and 8 designates agglomerate.

In the contact 1 according to the 19th embodiment, if, as shown in FIG. 12, the irregularities 7 are formed on the surfaces of the respective tip ends 3L and 3R, the protuberances 7a are engaged in the surface of the solder film 14b on the external connection terminal 14a, as shown in FIG. 13. As a result, an oxide film which is present on the surface of the solder film 14b is broken, and a contact area between the protuberance 7a and the solder film 14b is increased. Since a plurality of protuberances 7a are present on the tip end 3, there can be ensured a sufficient contact area between the protuberances 7a and the solder film 14b without involvement of relative sliding motion resulting from horizontal movement of the contact 1. Accordingly, an electrical signal can be transmitted/received by way of the contact 1. In other words, good electrical contact can be ensured for a long period of time while there is minimized formation of agglomerate, which would be caused when the protuberances 7a scrape the solder film 14b formed on the external connection terminal 14a.

In the present embodiment, formation of agglomerate, which would otherwise be caused by sliding action of the known contact, is minimized. However, when the protuberances 7a formed on the tip end 3 of the contact 1 are engaged with the solder film 14b, the agglomerate 8—which is an aggregation of solder or oxide scraped from the solder film 14b—is displaced into the recesses 7b. In the present embodiment, the agglomerate 8 is locally deposited in a trace amount. Deposition of the agglomerate 8 is described in comparison with the agglomerate 8 which is deposited on the known contact, by reference to FIGS. 14A and 14B. As shown in FIG. 14B, the agglomerate 8 is deposited over substantially the entirety of the tip end 3 to be brought into contact with an external connection terminal. The contact 1 would fail to establish good electrical contact with the external connection terminal 14a before long. In contrast, in the contact 1 according to the present embodiment, the agglomerate 8 is accumulated in the recesses 7b. As shown in FIG. 14A, the agglomerate 8 is scarcely present in the contact area where the contact 1 is in contact with the external connection terminal 14a. Even in a case where the agglomerate 8 is deposited on the tip end 3 through repetition of tests, the plurality of protuberances 7a can ensure electrical contact. Further, since relative sliding action, which would otherwise arise between the contact 1 and the external connection terminal 14a, is minimized, and hence agglomerate 8 is deposited in small amount. Thus, stable electrical contact can be established between the external connection terminal 14a and the contact 1 for a long period of time.

The geometry of the irregularities 7 formed in the surface of the tip end 3 according to the present embodiment will now be described in more detail. In order to ensure a contact area most efficiently, the curvature radius R of the top of the protuberance 7a is preferably set so as to assume substantially the same value as the thickness of the outermost layer of the external connection terminal 14a; that is, the thickness of the solder film 14b. A cavity formed by combination of the protuberances 7a and the recesses 7b is filled with the agglomerate 8 soon, if the cavity has a shallow depth D. For this reason, the depth D of the cavity is preferably set so as to assume a thickness which is greater than the thickness of the outermost layer on the external connection terminal 14a. In fact, the curvature radius R of the top of the protuberance 7a is preferably set so as to assume a value of about 10 μm, and the depth D of the cavity formed by combination of the protuberances 7a and the recesses 7b is preferably set so as to assume a value of about 20 μm. If the irregularities are formed from smoothly-curved surfaces of, for example, 0.2 μmRy or thereabouts, the agglomerate 8 preferably becomes more slippery, to thereby prevent deposition of the agglomerate 8.

(20th Embodiment))

FIG. 15 is a cross-sectional view showing irregularities formed in a tip end of a contact belonging to a test socket according to a 20th embodiment of the present invention. In the drawing, reference numeral 3 (3L or 3R) designates a tip end; 7a designates protuberances of the irregularities 7; 7b designates recesses; and 9 designates a conductive solder-resistant agglomerate member formed on the surface of the protuberances 7a.

In the contact (the entirety thereof is not shown) having the foregoing structure, the solder-resistant conductive agglomerate member 9 having a thickness of about 1 μm is formed on the protuberances 7a of the irregularities 7 formed on the tip end 3, thereby preventing coagulation of the agglomerate 8, such as solder chippings. Any substance may be employed as the solder-resistant conductive agglomerate member 9, so long as the substance has low chemical affinity for solder. For example, chromium, tungsten, titanium nitride, titanium nitride-oxide, and diamond-like carbon containing graphite components in high proportion are particularly preferable. The surface of the irregularities 7 of the tip end 3 can be coated with chromium by means of plating, and the surface of the irregularities 7 can be coated with any one of the other substances by means of vapor-phase composition technique.

(21st Embodiment))

FIG. 16 is a cross-sectional view showing irregularities formed on a tip end of a contact belonging to a test socket according to a 21st embodiment of the present invention. In the drawing, reference numeral 3 (3L or 3R) designates a tip end; 7a designates protuberances of the irregularities 7; 7b designates recesses; and 10 designates a solder-resistant non-conductive agglomerate member which is formed on the surface of the protuberances 7a.

In the contact 1 having such a structure (the entirety of the contact 1 is not shown), the solder-resistant non-conductive agglomerate member 10 having a thickness of, for example, about 1 μm is formed on the protuberances 7a of the irregularities 7 formed on the tip end 3, thereby preventing agglomeration of solder chippings into the agglomerate 8. Any substance may be employed as the solder-resistant non-conductive agglomerate member 10, so long as the substance has low chemical affinity for solder. For example, diamond or diamond-like carbon containing graphic components in low proportion is particularly preferable. The solder-resistant non-conductive agglomerate member 10 can be formed on the surface of the irregularities 7 formed on the tip end 3 by means of the vapor-phase composition technique. In order to ensure establishment of electrical contact between the tip end 3 and the external connection terminal 14a or a coating film formed on the external connection terminal 14a, the contact is subjected to oxygen plasma etching after a coating film has been formed on the tip end 3, to thereby remove a non-conductive film from an electrical connection section. Further, a portion of the surface of the irregularities 7 of the tip end 3, which portion is to act as an electrical connection section, may be covered with a resist film at the time of formation of the solder-resistant non-conductive agglomerate member 10.

(22nd Embodiment))

A method of producing the contact 1 in which the plurality of tip ends 3 described in any one of the 12th through 16th embodiments are connected to the different resilient sections 2, comprises a first step of punching, into a component, a member having the property of a spring by means of pressing, to thereby define the profile of a contact;

a second step of splitting a tip end of the thus-punched component into a plurality of tip ends, the tip end being brought into contact with a member to be tested; and a third step of coating the thus-punched component having the split tip ends.

Figure 30:
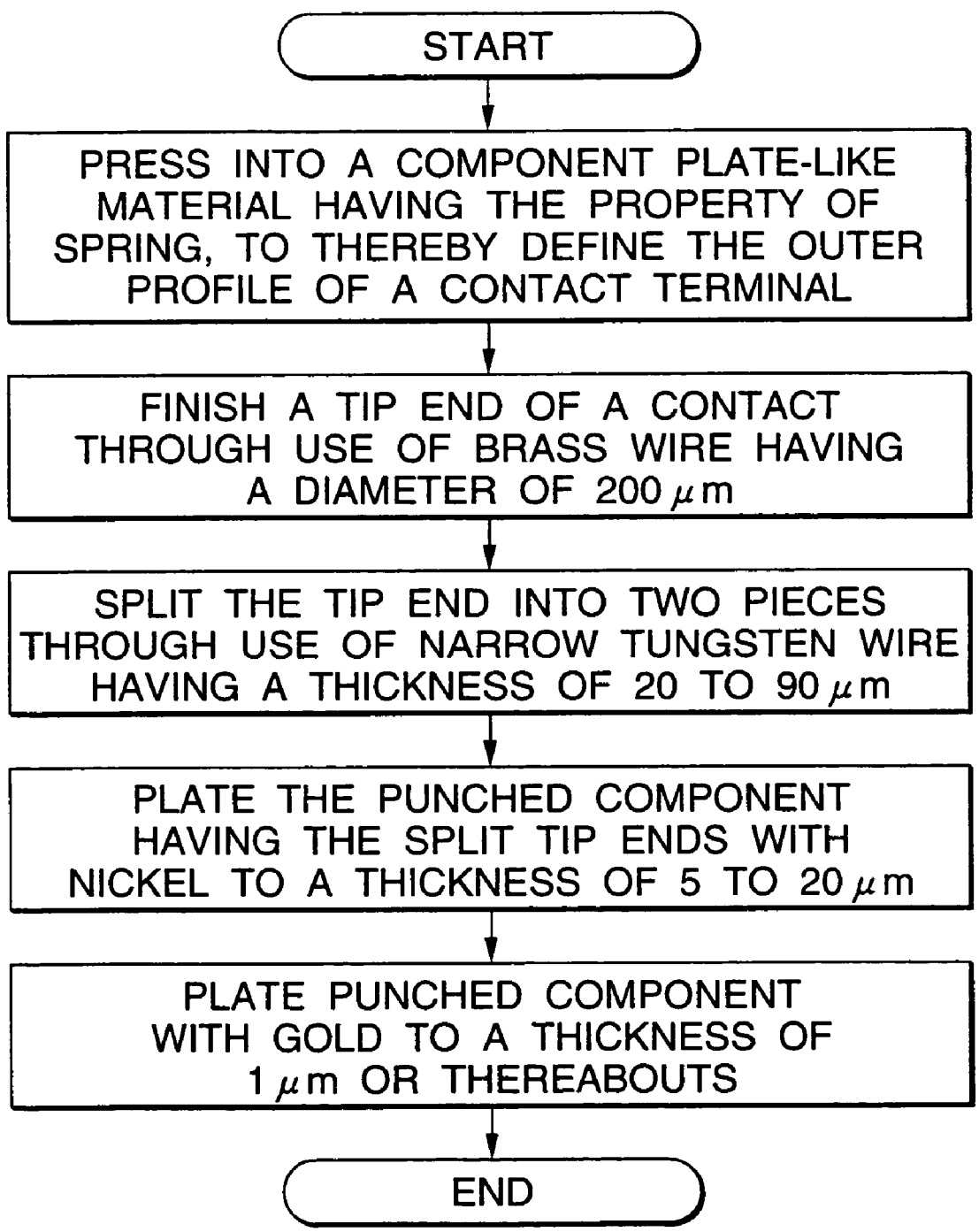
FIG. 30 is a flowchart showing specific example steps of a method of manufacturing a test socket according to a 22nd embodiment of the present invention.

FIG. 30 is a flowchart showing specific example steps of a method of manufacturing a test socket for use in testing an electronic device or semiconductor package according to the 22nd embodiment. For example, a plate-like member having the property of a spring and a thickness of hundreds of micrometers, such as beryllium copper or phosphor bronze, is pressed into a component, to thereby define the profile of the contact terminal 1. The head of the tip end 3 of the contact 1 is finished through use of a brass wire having a diameter of about 200 µm. Further, the tip end 2 is split into two pieces through use of a narrow tungsten wire having a diameter of 20 to 90 µm. The thus-punched component whose tip end has been split into two pieces is subjected to electrolytic nickel plating. In order to finish the component, the component is plated with gold to a thickness of about 1 µm for preventing oxidation. The width of a clearance defined between the tip ends 3L and 3R is controlled by means of the diameter of the tungsten wire used for splitting the tip end 3 or the thickness of plating through the foregoing steps, there can be readily manufactured the contact 1 comprising:

the tip ends 3L and 3R to be brought into contact with an external connection terminal of an electronic device or a semiconductor package;

the resilient section 2L connected to the tip end 3L;

the resilient section 2R connected to the tip end 3R;

the support section 6 connected directly to the resilient sections 2L and 2R or is connected to one resilient section by way of the other resilient section;

the base 4 connected to the support section 6 for positioning a test socket; and the terminal 5 to be connected to a test circuit board being connected to the base 4.

(23rd Embodiment))

A method of producing the contact 1 in which the irregularities 7 are formed in the tip end 3 described in the 19th embodiment, comprises a first step of punching, into a component, a member having the property of a spring by means of pressing, to thereby define the profile of a contact;

a second step of splitting a tip end of the thus-punched component into a plurality of tip ends, the tip end being brought into contact with a member to be tested;

a third step of forming, in the thus-split tip ends, a plurality of protuberances and recesses from smoothly-curved surfaces such that the protuberances and the recesses are arranged adjacent to each other; and a fourth step of coating the component whose tip end has been split and in which the irregularities are formed in the thus-split tip ends.

FIG. 31 is a flowchart showing specific example steps of a method of manufacturing a test socket for use in testing an electronic device or semiconductor package according to the 23rd embodiment. For example, a plate-like member having the property of a spring and a thickness of hundreds of micrometers, such as beryllium copper or phosphor bronze, is pressed into a component, to thereby define the profile of the contact terminal 1. The head of the tip end 3 of the contact 1 is split into two pieces through use of a narrow tungsten wire having a diameter of about 20 through 90 µm. The thus-split tip ends 3L and 3R of the contact 1 are made rough by means of any one of the electric discharge machining technique, the sand blasting technique, the liquid honing technique, and the etching technique. Protuberances formed in the thus-roughened surfaces of the tip ends 3L and 3R are plated with electrolytic nickel, and a solder film is grown until desired irregularities are formed. The thickness of the solder film is preferably determined by means of the degree of a roughening operation. The thickness of the solder film preferably assumes a value of 5 to 20 µm or thereabouts. Further, the thus-punched component which has been plated is plated with gold to a thickness of about 1 µm, to thereby prevent oxidation of the contact 1. The width of a clearance defined between the tip ends 3L and 3R is controlled by means of the diameter of the tungsten wire used for splitting the tip end 3 or the thickness of plating. Through the foregoing steps, there can be readily manufactured the contact 1 comprising:

the tip ends 3L and 3R to be brought into contact with an external connection terminal of an electronic device or a semiconductor package;

the resilient sections 2 connected to the respective tip ends 3L and 3R;

the support section 6 connected directly to the resilient sections 2 or is connected to one resilient section by way of the other resilient section;

the base 4 connected to the support section 6 for positioning a test socket;

the terminal 5 to be connected to a test circuit board being connected to the base 4;

the plurality of protuberances 7a which are formed in the tip ends 3L and 3R from smoothly-curved surfaces; and the plurality of recesses 7b which are adjacent to the protuberances 7a and formed from smoothly-curved surfaces.

In the present embodiment, the tip ends 3L and 3R of the contact 1 are roughened by means of the electric discharge machining or the like, and protuberances which are present in the thus-roughened area are plated with nickel. Through the steps according to the present embodiment, a plate-like member having the property of a spring, such as beryllium copper or phosphor bronze, is pressed into a component, to thereby define the profile of the contact terminal 1. The tip ends 3L and 3R are plated with cobalt, thereby producing a granular member having a diameter of about 20 µm. Thus, desired irregularities can be formed in the tip end 3 without involvement of an electric discharge machining operation as preliminary treatment.

The present embodiment has described an example manufacturing method of producing the contact 1 in which each of the tip ends 3L and 3R is provided with the roundly-pointed head 16. In order to produce the contact 1 in which the substantially hemi-spherical head 17 described in connection with the 17th embodiment is formed in each of the tip ends 3L and 3R, after the tip end 3 has been split into the tip ends 3L and 3R, the tip ends 3L and 3R are finished through use of a wire such that the head of each of the tip ends 3L and 3R assumes a substantially hemi-spherical shape. In order to produce the contact 1 in which the tip end described in connection with the 18th embodiment is finished so as to assume the corrugations 18 having a smooth corrugated cross section, the tip end 3 is finished by means of the electrical discharge machining or coining technique.

The present embodiment has not described a manufacturing method of plating the irregularities 7 formed on the tip end 3 described in connection with the 18th embodiment forming with a member having an agglomeration-resistant property. According to the manufacturing method by which the solder-resistant conductive agglomerate member 9 is formed on the irregularities 7 formed in the tip ends 3L and 3R, the solder-resistant conductive agglomerate member 9 is formed by means of plating or the vapor-phase composition technique, such as the PVD or CVD technique, in a step subsequent to the step in which the tip ends 3L and 3R have been plated with nickel. Further, in a subsequent step, the tip ends 3L and 3R are plated with gold for preventing oxidation of the contact 1. In order to prevent the solder-resistant conductive agglomerate member 9 from being coated with gold, a resist film is provided on the tip ends 3L and 3R.

According to the manufacturing method under which the solder-resistant nonconductive agglomerate member 10 according to the 21st embodiment is provided on the irregularities 7 formed in the tip ends 3L and 3R, the solder-resistant nonconductive agglomerate member 10 is formed by means of the vapor-phase composition technique, such as PVD or CVD, in a step subsequent to the step of plating the tip end 3 with electrolytic nickel. The tip end 3 is subjected to oxygen plasma etching in a subsequent step. In order to ensure electrical connection, the solder-resistant nonconductive agglomerate member 10 is removed from the tip end of the irregularities 7. In a subsequent step, the tip end 3 is plated with gold. In order to prevent the solder-resistant nonconductive agglomerate member 10 from being plated with gold, a resist film is provided on the tip end 3.

(24th Embodiment))

There is made comparison among the contact A of the test socket according to the 12th embodiment which is shown in FIG. 24 and in which the tip end 3 is split into two pieces, the contact B according to the 19th embodiment in which irregularities are formed in the tip end, and the known contact C shown in FIG. 20. FIG. 32 is a table showing a fraction defective of semiconductor packages which are tested through use of the three types of contacts; A, B, and C. A lot is divided into three groups for the respective contacts A, B, and C, each group comprising about 3000 electronic devices or semiconductor packages 14. A certain IC included in respective electronic device or semiconductor package 14 is tested through use of the contacts A, B, and C. The fraction defective detected by the contact A is reduced to one-fourth the fraction defective detected by the known contact C. Further, the fraction defective detected by the contact B is reduced to about one-seventh the fraction defective detected by the known contact C. The reason why the fraction defective detected by the known contact C has a large value is conceived to be attributable to the following situation: Namely, the electronic device or semiconductor package 14 is tested while the agglomerate 8 is interposed between the tip end 3 of the contact 1 and the external connection terminal 14a, to thereby hinder establishment of good electrical contact between the external connection terminal 14a and the tip end 13. As a result, an electronic device or semiconductor package 14 is determined to be defective even though the electronic device or semiconductor package 14 is actually non-defective. In contrast, the contact A according to the present invention suppresses relative sliding action of the tip end of the contact with respect to the external connection terminal. Even if resin chipping 16 has attached to the external connection terminal 14a, any one of the split tip ends 13L and 13R can establish electrical connection with the external connection terminal 14a, as a result of which the fraction defective of the electronic device is greatly diminished. Further, the protuberances 7a are formed in the tip end of the contact C according to the present embodiment, thereby resulting in an increase in contact area between the tip end and the external connection terminal and ensuring electrical connection between the same. In order to compare the three types of contacts with one another in terms of the length of life, the contacts A, B, and C are compared with one another with regard to maintenance from the view point of frequency of replacement, provided that contact resistance of 1 Ω or more is detected as a result of an increase in the area on the contact surface in which agglomerate is deposited. The tests show that the contact A is improved about 10 times in terms of maintenance when compared with the known contact C and that the contact B is improved about four times in terms of maintenance when compared with the known contact C. The reason for this can be considered to be that the contacts A and B have minimized generation of agglomerate and that the contact B can eliminate the agglomerate 8 into the recesses.

The present embodiment has described a method of testing an electronic device or semiconductor package, particularly, an IC, through use of a test socket. The method can also be used for testing a printed board or a liquid-crystal device other than an IC, by means of bringing a contact according to the present invention into contact with an external connection terminal of a printed board or liquid-crystal device.

(25th Embodiment))

By means of the test described in connection with the 24th embodiment, flaws formed in the surface of the external connection terminal 14a of the semiconductor package 14, which flaws are formed by the contact A which has the plurality of tip ends 3 according to the 12th embodiment, the contact B whose tip end 3 has the irregularities 7 formed thereon and which is described in connection with the 14th embodiment, and the known contact C shown in FIG. 20. Small flaws of about 10 μm are found in the external connection terminal which is tested through use of the contacts A and B. Large flaws of 50 to 100 μm are found in the external connection terminal which is tested through use of the contact C. It could be ascertained that flaws, which would be formed in an external connection terminal by a contact, can be made small by means of preventing horizontal sliding action of the contact.

The present invention having the foregoing structure yields the following advantages.

A tip end of a contact to be brought into contact with an external connection terminal of an electronic device or semiconductor package comprises a plurality of tip ends, and the tip ends are connected to different resilient sections. The resilient sections are directly connected to a single support section, or one resilient section is connected to the single support section by way of another resilient section. The force exerted downward on the tip ends causes deflections of the resilient sections. The force which is exerted on the tip ends 3 in reaction to the downward deflection of the resilient sections brings the tip end 3 into pressing contact with the external connection terminal 14a. At this time, the tip ends involve horizontal movement. However, the tip ends come into collision with each other, thereby suppressing horizontal movement. Since a member constituting the external connection terminal 14a or oxides formed on the external connection terminal 14a are scraped in a smaller amount, there can be prevented generation and accumulation of agglomerate on the surfaces of the tip ends. Therefore, a highly-reliable test can be effected for a long period of time. The present invention also prevents occurrence of a short-circuit failure, which would otherwise be caused when the agglomerate adhering to the external connection terminal comes off from the tip end and attaches to the external connection terminal. Even if resin chipping 16 is caught between the external connection terminal and one of the tip ends, thereby failing to establish electrical contact, the remaining tip ends can establish electrical contact with the external connection terminal.

The resilient sections connected to the respective tip ends are provided opposite to each other and are bent so as to extend horizontally with respect to the tip ends. The force exerted downward on the tip ends is equally distributed between the plurality of resilient sections, and the resilient sections are eventually deflected in substantially the vertical direction. Although the tip ends attempt to cause horizontal movement, the tip ends come into collision with the adjacent tip ends, thereby preventing horizontal movement of the tip ends. Thus, as mentioned above, the present invention can yield an advantage of preventing generation and accumulation of agglomerate on the surfaces of the tip ends and effecting a highly-reliable test for a long period of time.

A clearance defined between the plurality of tip ends yields an advantage of preventing horizontal movement of the tip ends. Particularly, in a case where a protuberance is formed on the side of each of the tip ends and where a clearance is defined between the plurality of tip ends, the tops of the tip ends can be separated from each other, thereby preventing occurrence of disconnection between the external connection terminal and the contact.

A vector is defined by means of interconnecting a resilient section connected to a tip end, the center of a connection section at which a support section supports the resilient section, and the center of the tip end to be brought into contact with an external connection terminal of a member to be tested. The vector substantially matches the direction in which the tip end is brought into contact with the external connection terminal. As mentioned above, the tip ends come into collision with the adjacent tip ends, thereby preventing horizontal movement of the tip ends. Thus, as mentioned above, the present invention can yield an advantage of preventing generation and accumulation of agglomerate on the surfaces of the tip end. The distance between a seat of a test socket and the tip end of the contact can be reduced.

A substantially hemi-spherical or roundly-pointed head is formed at a portion of a tip end to be brought into contact with an external connection terminal of an electronic device or semiconductor package. Further, a curvature radius of the tip end is set so as to assume a value of 0.3 mm or less. Consequently, contact resistance arising between an external connection terminal and a tip end can be made small, as a result of which a highly-reliable test can be effected for a long period of time.

The tip end to be brought into contact with an external connection terminal of an electronic device or semiconductor package is formed so as to assume a smooth corrugated cross section, and the curvature radius of the tip end is particularly set so as to assume a value of 0.3 mm or less. As a result, contact resistance arising between an external connection terminal and a tip end can be made small, as a result of which a highly-reliable test can be effected for a long period of time.

A plurality of protuberances formed from smoothly-curved surfaces and a plurality of recesses which are adjacent to the protuberances and formed from smoothly-curved surfaces are formed in the tip end to be brought into contact with an external connection terminal of an electronic device or semiconductor package. As a result, the protuberances are engaged with a solder film covering the external connection terminal. Thus, the tip end can be brought into contact with the external connection terminal without fail. Agglomerate resulting from the protuberances engaging with the solder film can be eliminated into the recesses. Although the agglomerate is deposited into the recesses in trace amount, contact between the external connection terminal and the tip end can be ensured at all times by means of the plurality of protuberances, thereby enabling stable electrical connection for a long period of time.

Further, an agglomerate-resistant member is provided on the tip end to be brought into contact with an external connection terminal of an electronic device or semiconductor package or on the irregularities on the tip end. As a result, agglomeration of agglomerate, such as a trace amount of solder chippings, can be prevented. Further, the present invention yields an advantage of prolonging the life of a test socket.

The agglomerate-resistant member is selected from the group comprising chromium, tungsten, titanium nitride, titanium carbide, and diamond-like carbon containing graphite components in high proportion. Presence of the agglomerate-resistant member makes extremely low chemical affinity of solder for a tip end to be brought into contact with an external connection terminal of an electronic device or semiconductor package or for irregularities formed on the tip end. Consequently, agglomerate becomes difficult to adhere to the tip end. Thus, the present invention yields an advantage of prolonging the life of a test socket.

The agglomerate-resistant member is selected from either diamond-like carbon containing graphite in low proportion or diamond. The agglomerate-resistant member is provided on the tip end other than the area where the tip end establishes electrical connection with an external connection terminal. Presence of the agglomerate-resistant member makes extremely low chemical affinity of solder for irregularities formed in a tip end, which tip end is to be brought into contact with an external connection terminal of an electronic device or semiconductor package or for irregularities formed on the tip end. Thus, the present invention yields the same advantage as that mentioned above.

The present invention employs a manufacturing method comprising the steps of:
punching a member into a component so as to define the profile of a contact of a test socket belonging to an electronic device or semiconductor package;
splitting a tip end of the contact into a plurality of pieces by means of wire cutting;
plating the thus-punched component with nickel; and
plating the thus-plated component with gold.

As a result, there can be readily and inexpensively manufactured a test socket which has a required profile, comprises a plurality of tip ends, and is plated with a film for preventing oxidation.

The present invention also employs a manufacturing method comprising the steps of:

punching a member into a component, so as to define the profile of a contact of a test socket belonging to an electronic device or semiconductor package;

splitting a tip end of the contact into a plurality Qf pieces by means of wire cutting;

roughening the surfaces of the tip ends through electric discharge machining;

plating the thus-roughened component with nickel; and plating the thus-plated component with gold.

As a result, there can be readily and inexpensively manufactured a test socket which has a required profile, comprises a plurality of tip ends having irregularities formed therein, and is plated with a film for preventing oxidation.

Since the contact of the test socket of an electronic device or semiconductor package can establish electrical contact stably and continuously with an external connection terminal of the electronic device or semiconductor package, the reliability of electrical test of an electronic device or semiconductor package can be improved. Further, since the test socket can be used over a long period of time, the present invention yields an advantage of reducing the frequency of replacement of a test socket, thereby improving the maintenance characteristic of a test socket.

Since the electronic device or semiconductor package is tested through use of the contact without involvement of horizontal sliding action of the tip end or with involvement of a trace amount of horizontal sliding action of the tip end, the present invention yields an advantage of ability to reduce flaws, which would otherwise arise in the external connection terminal as a result of the contact coming into contact with the external connection terminal. Further, the present invention prevents occurrence of an electrical shortcircuit, which would otherwise be caused when flakes of agglomerate coming off from the tip end adhere to an external connection terminal. The present invention also prevents occurrence of a shortcircuit failure, which would otherwise be caused by the agglomerate adhering to the external connection terminal at the time of mounting of a semiconductor package.

What is claimed is:

1. A test socket comprising:
    a contact to be electrically connected to an external connection terminal of a member to be tested and is to be used for testing the electrical characteristic of the member, wherein
    said contact includes:
    a plurality of tip ends to be brought into contact with the external connection terminal;
    resilient sections connected to said respective tip ends;
    a support section to which said resilient sections are connected or to which one resilient section is connected by way of the other resilient section;
    a base extending perpendicular to the support; and
    a terminal extending perpendicular to the base, said terminal to be inserted into a test board.

2. The test socket as defined in claim 1, wherein
    said resilient sections connected to said tip ends are two members which are disposed opposite to each other and bent so as to extend horizontally in opposite horizontal directions with respect to said tip ends.

3. The test socket as defined in claim 2, wherein
    a clearance is defined between said plurality of tip ends.

4. The test socket as defined in claim 1, wherein
    a vector is defined by means of interconnecting a resilient section connected to a tip end, the center of a connection section at which a support section supports the resilient section, and the center of said tip end to be brought into contact with an external connection terminal of a member to be tested, the vector substantially matching the direction in which said tip end is brought into contact with said external connection terminal.

5. The test socket as defined in claim 1, wherein
    a portion of at least one of said tip ends to be brought into contact with said external connection terminal of the member to be tested is formed into a roundly-pointed shape or a substantially hemi-spherical shape.

6. The test socket as defined in claim 1, wherein
    a portion of at least one of said tip ends to be brought into contact with said external connection terminal of the member is formed so as to assume a smooth corrugated geometry.

7. The test socket as defined in claim 6, wherein
    a plurality of protuberances and recesses are formed from smooth surfaces in at least one of the tip ends to be brought into contact with the external connection terminal of the member such that the protuberances and recesses are adjacent to each other are formed.

8. The test method involving use of the test socket as defined in claim 1, comprising the steps of:
    bringing an external connection terminal of a member to be tested into contact with a tip end of the contact of said test socket;
    sending, to said member, an electric signal transmitted from a terminal connected to a circuit board; and
    testing the operation of the member through use of the electric signal returned from the test member.

* * * * *